(12) United States Patent
Antoku et al.

(10) Patent No.: US 7,911,745 B2
(45) Date of Patent: Mar. 22, 2011

(54) THIN-FILM MAGNETIC HEAD COMPRISING A MAGNETO-RESISTIVE EFFECT DEVICE OF THE CPP STRUCTURE INCLUDING A RE-MAGNETIZING BIAS LAYER AND MAGNETIC DISK SYSTEM

(75) Inventors: Yosuke Antoku, Tokyo (JP); Tsuyoshi Umehara, Tokyo (JP); Tetsuya Kuwashima, Tokyo (JP)

(73) Assignee: TDK Corporation, Tokyo (JP)

( * ) Notice: Subject to any disclaimer, the term of this patent is extended or adjusted under 35 U.S.C. 154(b) by 822 days.

(21) Appl. No.: 11/844,693

(22) Filed: Aug. 24, 2007

(65) Prior Publication Data

US 2009/0052089 A1 Feb. 26, 2009

(51) Int. Cl.
*G11B 5/39* (2006.01)
(52) U.S. Cl. ................................. 360/324.12
(58) Field of Classification Search ............... 360/324.1, 360/324.11, 324.12, 324.2, 319
See application file for complete search history.

(56) References Cited

U.S. PATENT DOCUMENTS

| | | | | |
|---|---|---|---|---|
| 6,157,524 A | * | 12/2000 | Nakazawa et al. | 360/324.12 |
| 7,370,404 B2 | * | 5/2008 | Gill et al. | 29/603.08 |
| 7,672,091 B2 | * | 3/2010 | Xue et al. | 360/324.12 |
| 2008/0043380 A1 | * | 2/2008 | Akie | 360/324.11 |

FOREIGN PATENT DOCUMENTS

| | | |
|---|---|---|
| JP | 2002-109708 | 4/2002 |
| JP | 2003-92439 | 3/2003 |
| JP | 2005-78666 | 3/2005 |

\* cited by examiner

*Primary Examiner* — Jefferson Evans
(74) *Attorney, Agent, or Firm* — Oblon, Spivak, McClelland, Maier & Neustadt, L.L.P.

(57) ABSTRACT

A thin-film magnetic head includes a magneto-resistive effect device of the CPP structure including a multilayer film comprising a stack of a fixed magnetization layer, a nonmagnetic layer and a free layer stacked one upon another in order, with a sense current applied in the stacking direction of the multilayer film, and an upper shield layer and a lower shield layer with the magneto-resistive effect device held between them in the thickness direction, and further comprises a bias magnetic field-applying layer located at each end of the multilayer film in the widthwise direction and a re-magnetizer unit designed such that when the bias magnetic field-applying layers malfunction, they are re-magnetized to go back to normal.

14 Claims, 19 Drawing Sheets

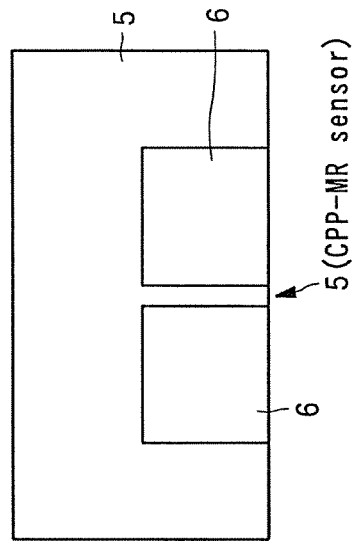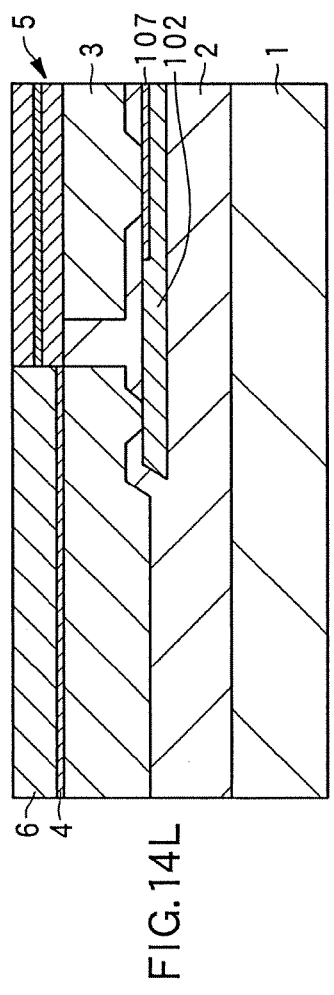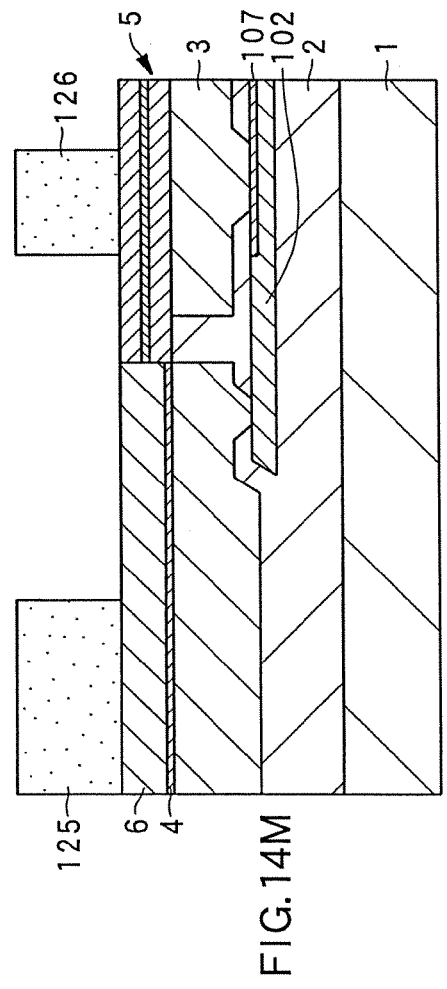

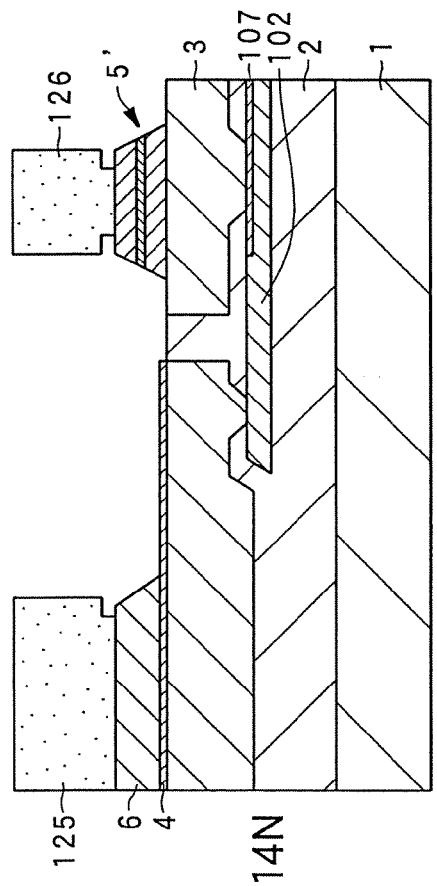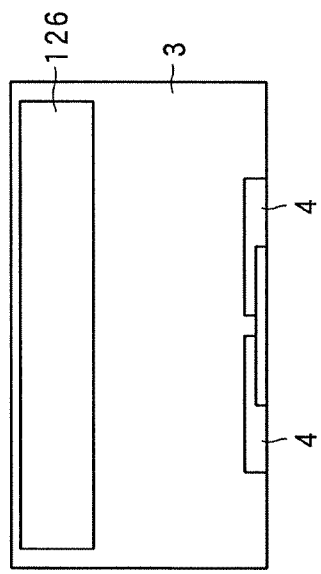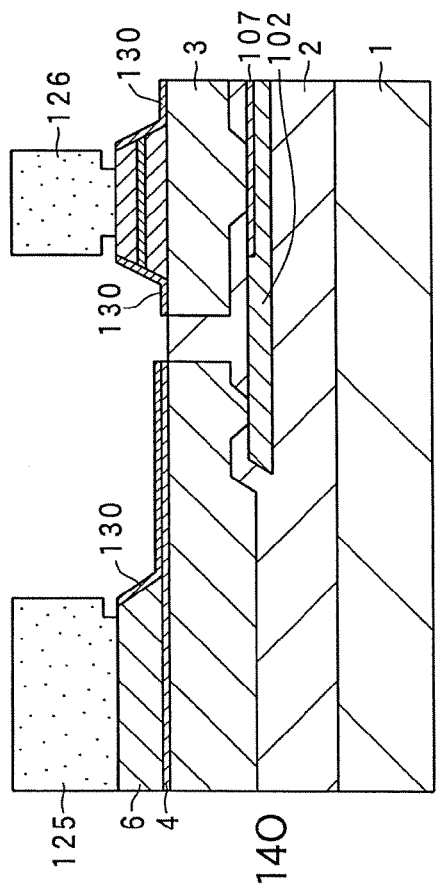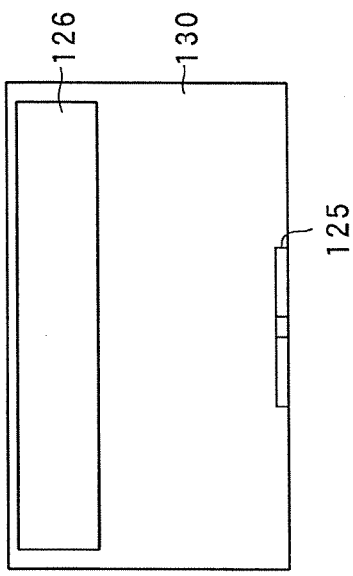

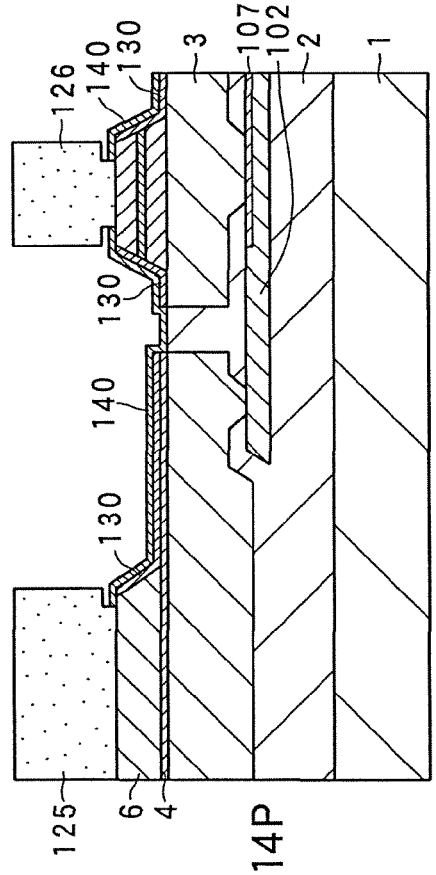
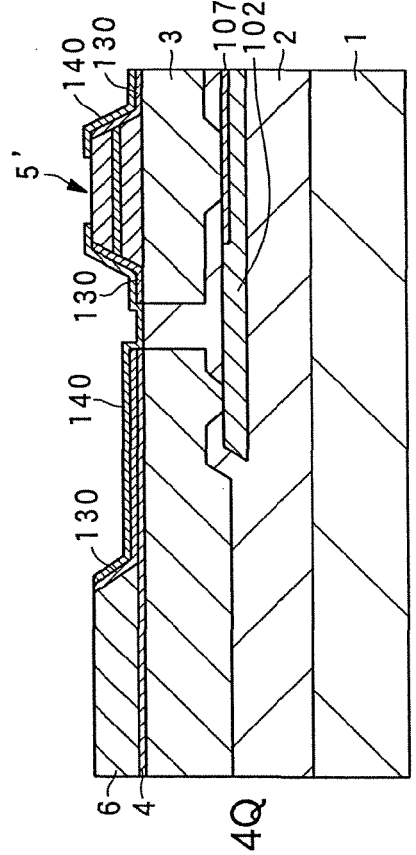
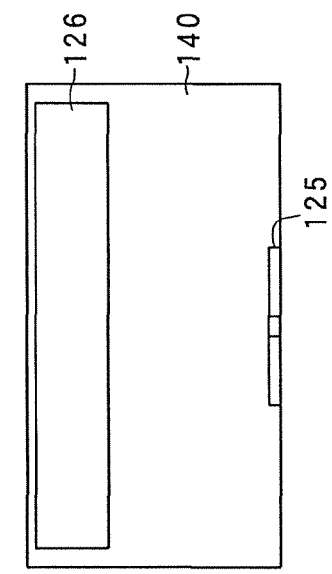
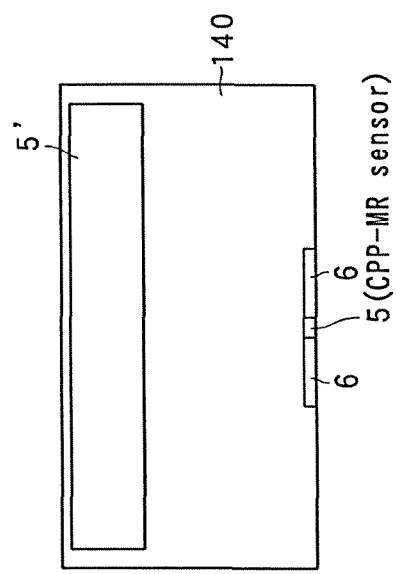
FIG.14P
FIG.15P
FIG.14Q
FIG.15Q

THIN-FILM MAGNETIC HEAD COMPRISING A MAGNETO-RESISTIVE EFFECT DEVICE OF THE CPP STRUCTURE INCLUDING A RE-MAGNETIZING BIAS LAYER AND MAGNETIC DISK SYSTEM

BACKGROUND OF THE INVENTION

1. Field of the Invention

The present invention relates to a thin-film magnetic head comprising a magneto-resistive effect device for reading the magnetic field strength of a magnetic recording medium or the like as signals, and a head gimbal assembly and a magnetic disk system, each comprising that thin-film magnetic head.

2. Explanation of the Prior Art

In recent years, with an increase in the plane recording density of magnetic disk systems, there have been growing demands for improvements in the performance of thin-film magnetic heads. For the thin-film magnetic head, a composite type thin-film magnetic head has been widely used, which has a structure wherein a reproducing head having a read-only magneto-resistive effect device (hereinafter often called the MR device) and a recording head having a write-only induction type magnetic device are stacked together.

The MR device, for instance, includes an AMR device harnessing the anisotropic magneto-resistive effect, a GMR device making use of the giant magneto-resistive effect, and a TMR device taking advantage of the tunnel-type magneto-resistive effect.

Requirements for reproducing heads, among other, are high sensitivity and high output. For reproducing heads meeting such requirements, GMR heads using a spin valve type GMR device have already been mass produced. The reproducing heads using a TMR device, too, are being mass produced so as to meet further improvements in the areal density.

In general, the spin valve type GMR device comprises a nonmagnetic layer, a free layer formed on one surface of that nonmagnetic layer, a fixed magnetization layer formed on another surface of the nonmagnetic layer, and a pinning layer (generally an antiferromagnetic layer) on the side of the fixed magnetization layer facing away from the non-magnetic layer. The free layer has its magnetization direction changing depending on an external magnetic field, and the fixed magnetization layer has its magnetization direction fixed by a magnetic coupling with the pinning layer (antiferromagnetic layer). On each side of the device, there is a bias magnetic field-applying layer formed to apply a bias magnetic field to the free layer, thereby reducing Barkhausen noise.

By the way, common GMR heads used so far in the art have a CIP (current in plane) structure wherein a current for detecting magnetic signals (the so-called sense current) is passed parallel with the plane of each of the layers forming the GMR device (CIP-GMR device). On the other hand, GMR devices having the so-called CPP (current perpendicular to plane) structure wherein the sense current is passed perpendicularly to the plane of each of the layers forming the GMR device (CPP-MR device), too, are now under development as next-generation ones. The aforesaid TMR devices, too, would come under the CPP structure category according to a classification system from the current-passing direction alone.

In the thin-film magnetic head comprising a magneto-resistive effect device of such CPP structure, bias magnetic field-applying layers are located on two sides of the magneto-resistive effect device. Those bias magnetic field-applying layers are operable to apply a so-called longitudinal bias to the device with the result that a given external magnetic filed can be detected while holding back the generation of noises.

Important for the longitudinal bias applied from the bias magnetic field-applying layers to the device is that it acts always consistently to the device while the hard disk device is in operation.

In some cases, however, the performance of the longitudinal bias degrades by reason of stress due to the head disk interface (for instance, head-on collision of the magnetic head and the hard disk, frictional heat that may be generated between the magnetic head and the hard disk, etc.), stress engendered by environmental temperature changes (for instance, fluctuations on the order of −30% to +100%), stress caused by application of magnetic fields from outside, etc.

As the performance of the longitudinal bias degrades, the operation of the reproducing head becomes erratic, ending up with a growing likelihood of malfunction of the hard disk system.

The inventors have already learned that when such erratic operation of the hard disk system is caused by degradation of the bias magnetic field-applying layers, it can substantially go back to normal if the head is removed out by dismantling the hard disk system and a given magnetic field is applied to the bias magnetic field-applying layers to re-magnetize them.

If a re-magnetizer element and electric circuit for re-magnetization are previously built in a magnetic head so that when the bias magnetic field-applying layers of the magnetic head degrade, the re-magnetizer element is actuated to re-magnetize the bias magnetic field-applying layers without dismantling the hard disk system whereby the hard disk system is kept going on, it would be very much beneficial and convenient for both makers and users.

In view of such situations, the present invention has been made with a view to providing a thin-film magnetic head designed such that when the bias magnetic field-applying layers of the head degrade with an increasing error rate of the hard disk system, they can be re-magnetized without dismantling the hard disk system so that it can be kept operating normally.

SUMMARY OF THE INVENTION

According to the invention, the aforesaid object is accomplished by the provision of a thin-film magnetic head comprising a magneto-resistive effect device of the CPP (current perpendicular to plane) structure including a multilayer film in which a fixed magnetization layer, a nonmagnetic layer and a free layer are stacked together in order, with a sense current passing in the thickness direction of said multilayer film, and an upper shield layer and a lower shield layer located such that said magneto-resistive effect device is held between them in the thickness direction, wherein said free layer functions such that the direction of magnetization changes depending on an external magnetic field; said fixed magnetization layer has the direction of magnetization fixed by an anti-ferromagnetic layer exerting pinning action; said fixed magnetization layer, said nonmagnetic layer and said free layer extend rearward from an air bearing surface that is a plane in opposition to a medium; and said multilayer film is provided with a bias magnetic field-applying layer and a re-magnetizer unit at each end in the widthwise direction; so that when said bias magnetic field-applying layer malfunctions, said re-magnetizer unit is actuated to re-magnetize said bias magnetic field-applying layer to get it back to normal.

In a preferable embodiment of the thin-film magnetic head of the invention, said re-magnetizer unit is a diode formed at a position between said upper shield layer and said lower shield layer and in the rear of said magneto-resistive effect device, so that a voltage higher than a diode operating voltage (the threshold value) is applied between said upper shield layer and said lower shield layer, thereby conducting a current through said diode to generate a magnetic field that in turn re-magnetizes said bias magnetic field-applying field.

In a preferable embodiment of the thin-film magnetic head of the invention, said re-magnetizer unit is a diode formed substantially below said lower shield layer, so that a voltage higher than a diode operating voltage (a threshold value) is applied between said upper shield layer and said lower shield layer, thereby conducting a current through said diode to generate a magnetic field that in turn re-magnetizes said bias magnetic field-applying field.

In a preferable embodiment of the thin-film magnetic head of the invention, said diode is a Schottky diode or a PN junction diode.

In a preferable embodiment of the thin-film magnetic head of the invention, said diode is a PN junction diode, a Zener diode, an avalanche diode, or a Schottky diode.

In a preferable embodiment of the thin-film magnetic head of the invention, the magnetic field for re-magnetization applied to said bias magnetic field-applying layer is at least 1.2 kOe.

In a preferable embodiment of the thin-film magnetic head of the invention, said magneto-resistive effect device of the CPP structure is a TMR device, or a CPP-MR device.

The invention also provided a head gimbal assembly, comprising a slider including a thin-film magnetic head as recited in claim 1 and located in opposition to a recording medium, and a suspension adapted to resiliently support said slider.

Further, the invention provides a magnetic disk system, comprising a slider including a thin-film magnetic head as recited in claim 1 and located in opposition to a recording medium, and a positioning means adapted to support and position said slider with respect to said recording medium.

DETAILED EXPLANATION OF THE INVENTION

The best mode for carrying out the invention is now explained in details.

Figure 1:
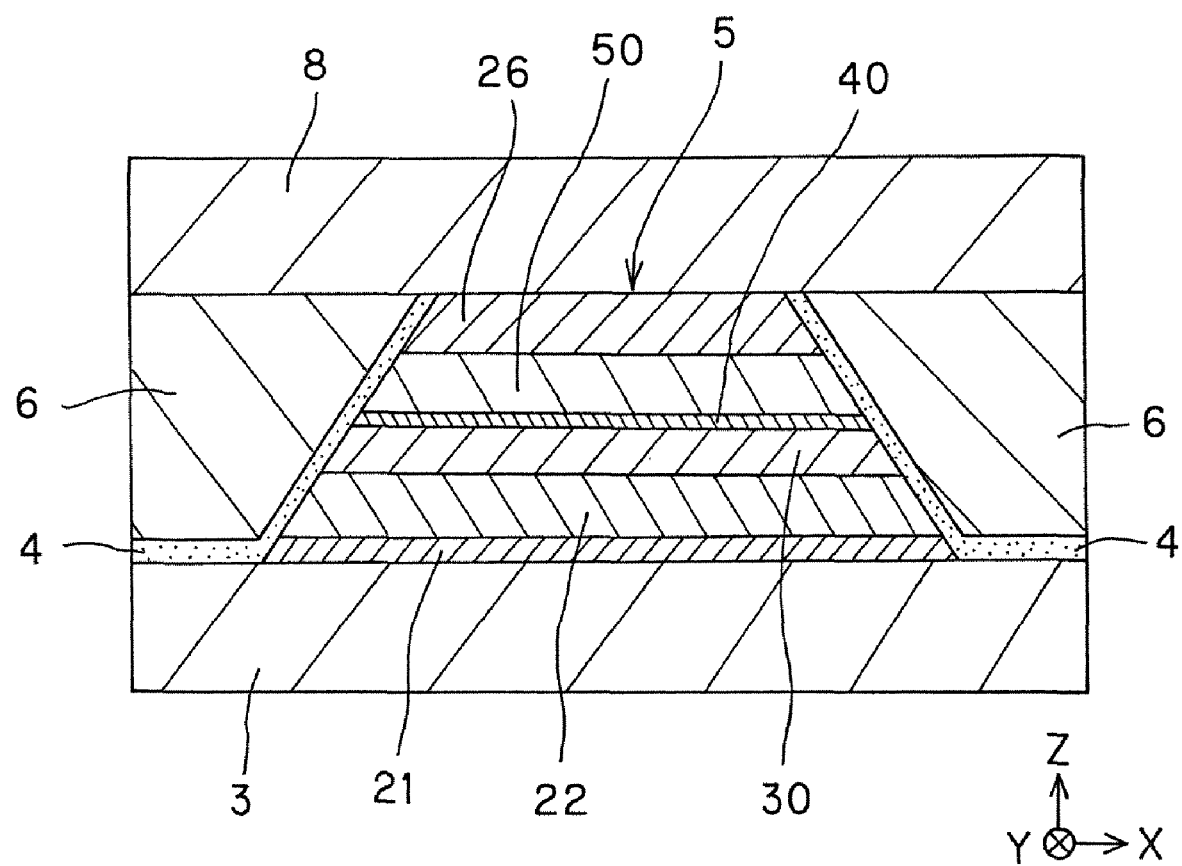
FIG. 1 is illustrative in section of the reproducing head in particular parallel with the medium opposite plane in an embodiment of the invention.

FIG. 1 is illustrative of the ABS (air bearing surface) of an embodiment of the invention; it is illustrative in schematic of the ABS of the magneto-resistive effect device (CPP-MR device) in particular—part of the invention. The abbreviation "ABS" is generally corresponding to a plane (hereinafter often called the medium opposite plane) at which the reproducing head is in opposition to a recording medium; however, it is understood that the ABS here includes even a section at a position where the multilayer structure of the device can be clearly observed. For instance, a protective layer such as DLC (the protective layer adapted to cover the device), in a strict sense, positioned at the medium opposite plane may be factored out, if necessary.

Figure 2:
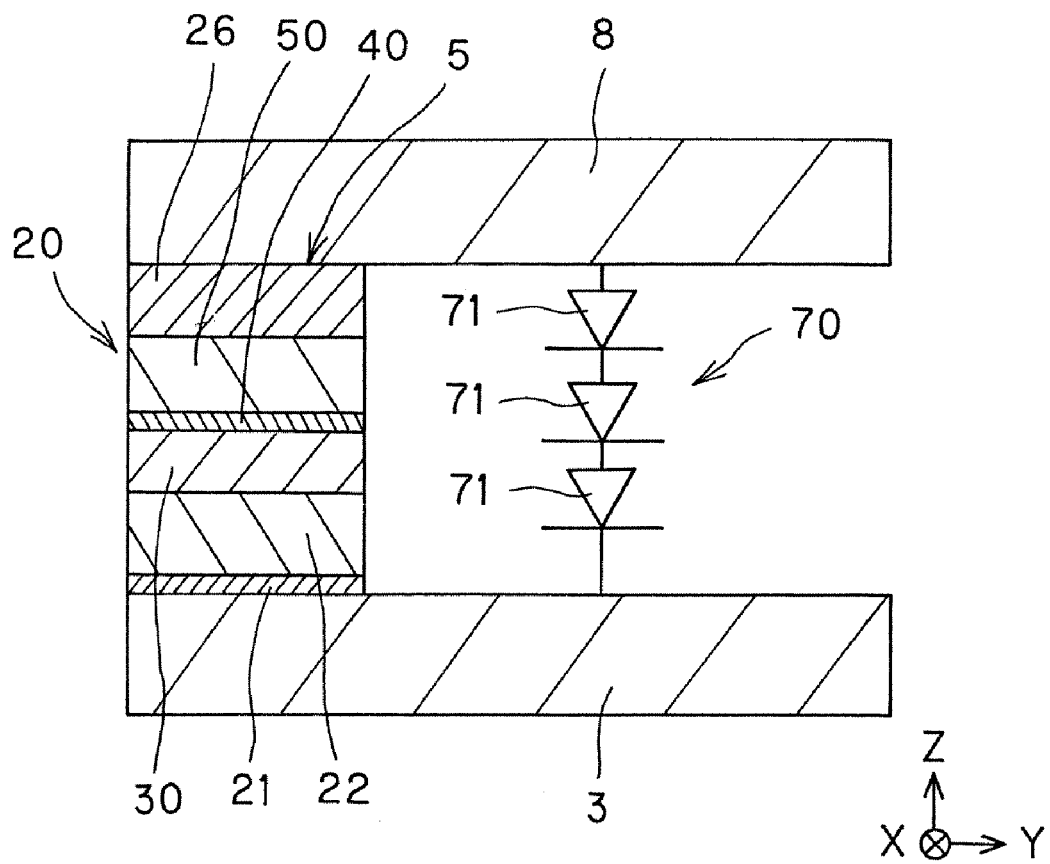
FIG. 2 is illustrative in longitudinal section of FIG. 1.
Figure 3:
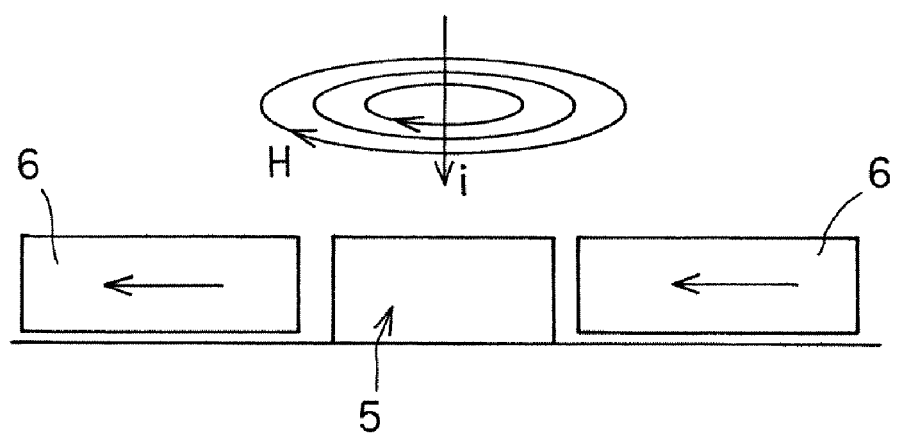
FIG. 3 is a model view that provides an easy-to-understand representation of the operation of part of the invention, as viewed from the ABS.
Figure 4:
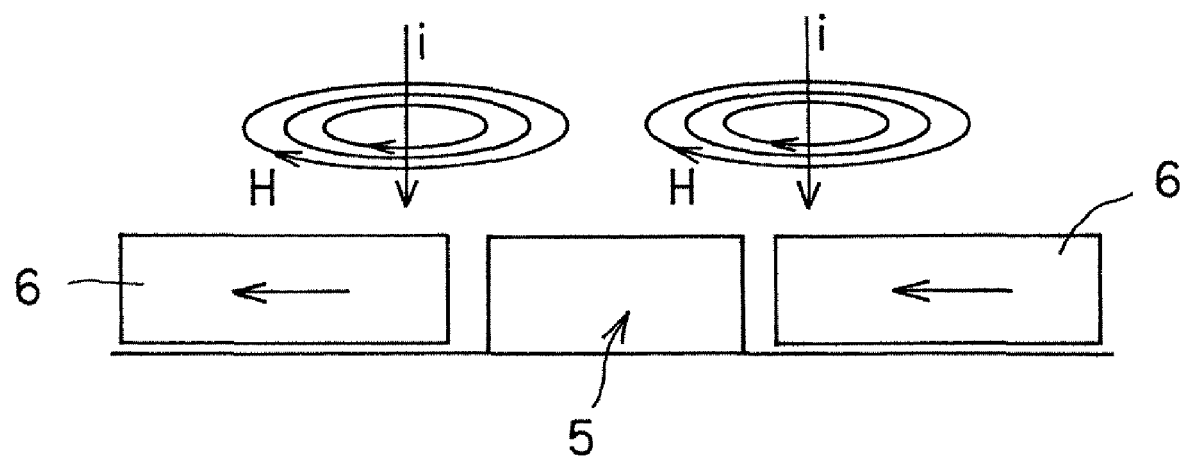
FIG. 4 is another model view similar to FIG. 3, as viewed from the ABS.

FIG. 2 is illustrative in schematic of the longitudinal section of FIG. 1, FIG. 3 is a model view of the operation of part of the invention that helps an easy understanding of the operation of part of the invention, and FIG. 4 is another model view similar to FIG. 3, as viewed from the ABS.

In the following disclosure of the invention, the sizes of each device component in the X-, Y- and Z-axis directions shown in the drawings will be referred to as the "width", "length" and "thickness", respectively. The side of the device nearer to the air bearing surface (the plane of the thin-film magnetic head in opposition to the recording medium) in the Y-axis direction will be called "forward" and the opposite side (depth-wise side) will be called "rearward", and the direction of stacking the individual films up will be called "upward" or "upper side" and the opposite direction will be called "downward" or "lower side".

[Explanation of the Reproducing Head Comprising the Inventive Magneto-resistive Effect Device (CPP-MR Device of the CPP Structure)]

The construction of the reproducing head (thin-film magnetic head) comprising the inventive magneto-resistive effect device of the CPP structure (CPP-MR device) is now explained in details with reference to FIGS. 1 and 2.

FIG. 1 is illustrative of the section of the reproducing head parallel with the medium opposite plane, as noted above. As shown in FIG. 1, the reproducing head according to the embodiment here comprises a first shield layer 3 (often called the lower shield layer 3) and a second shield layer 8 (often called the upper shield layer 8) that are located at a given space and opposed vertically on the sheet, a magneto-resistive effect device 5 (often called simply the CPP-MR device 5) interposed between the first shield layer 3 and the second shield layer 8, an insulating film 4 adapted to cover two side of the CPP-MR device 5 and a part of the upper surface of the first shield layer 3 along those side, and two bias magnetic field-applying layers 6 located in such a way as to be adjacent to both sides of the CPP-MR device 5 by way of the insulating film 4.

In the embodiment here, the first 3 and the second shield layer 8 take a so-called magnetic shield role plus a pair-of-electrodes role. In other words, they have not only a function of shielding magnetism but also function as a pair of electrodes adapted to pass a sense current through the CPP-MR device 5 in a direction intersecting the plane of each of the layers constituting the CPP-MR device 5, for instance, in the direction perpendicular to the plane of each of the layers constituting the CPP-MR device 5 (stacking direction).

Apart from the first 3 and the second shield layer 8, another pair of electrodes may be additionally provided above and below the CPP-MR device 5.

The magneto-resistive effect device 5 of the CPP structure (CPP-MR device), for instance, includes a CPP-GMR device harnessing the giant magneto-resistive effect, and a TMR device harnessing the tunnel-type magneto-resistive effect.

In general, the CPP-GMR device comprises a non-magnetic layer, a free layer formed on one surface of the nonmagnetic layer, a fixed magnetization layer formed on the other surface of the nonmagnetic layer, and a pinning layer (generally an antiferromagnetic layer) formed in contact with the side of the fixed magnetization layer that faces away from the nonmagnetic layer. The free layer has the direction of magnetization changing depending on a magnetic field from outside, and the fixed magnetization layer has the direction of magnetization fixed by an exchange coupling with the pinning layer (the antiferromagnetic layer).

In general, the TMR device comprises a free layer, a fixed magnetization layer, a tunnel barrier layer interposed between them, and a pinning layer (anti-ferromagnetic layer) located on the surface of the fixed magnetization layer that faces away from the surface in contact with the tunnel barrier layer. The tunnel barrier layer is a nonmagnetic layer through which electrons with spins reserved can pass by way of the tunnel effect. Other layers, for instance, the free layer, fixed magnetized layer and pinning layer (antiferromagnetic layer) could be basically identical with those used with the spin valve type GMR device.

In the reproducing head shown in FIGS. 1 and 2 the purpose of illustration alone, the CPP-MR device 5 has a multilayer film wherein an antiferromagnetic layer 22 formed on the first shield layer 8 via an underlay layer 21 and functioning as a pinning layer, a fixed magnetization layer 30 formed on the antiferromagnetic layer 22, a nonmagnetic layer 40 formed on the fixed magnetization layer 30, a free layer 50 formed on the nonmagnetic layer 40 and a cap layer (protective layer) 26 formed on the free layer 50 are stacked together in order. This multilayer film is held between the first 3 and the second shield layer 8, and by applying voltage between the first 3 and the second shield layer 8, there is a sense current flowing in the thickness direction of the multilayer film.

The free layer 50 has its magnetization direction changing dependent on an external magnetic field. The fixed magnetization layer 30 has its magnetization direction fixed by the action of the antiferromagnetic layer 22 having a pinning action.

As shown in FIG. 2, the multilayer film comprising the antiferromagnetic layer 22, fixed magnetization layer 30, nonmagnetic layer 40 and free layer 50 forming the CPP-MR device 5 extends rearward (the depth side: the Y-direction) from the air bearing surface 20 that is a plane in opposition to the medium.

In what follows, each of the layers constituting the CPP-MR device 5 will be further explained.

(Explanation of the Fixed Magnetization Layer 30)

In the invention, the fixed magnetization layer 30 is formed on the antiferromagnetic layer 22 having a pinning action via the underlay layer 21 formed on the first shield layer 3.

The fixed magnetization layer 30 may be configured in either one single layer form or multilayer form.

Referring typically to the multilayer form that is a preferable form, the fixed magnetization layer has a so-called synthetic pinned layer comprising, in order from the side of the antiferromagnetic layer 22, an outer layer, a nonmagnetic intermediate layer and an inner layer, all stacked together in order. The outer and the inner layer are each provided by a ferromagnetic layer made of, for instance, a ferromagnetic material containing Co, and Fe. The outer and the inner layer are antiferromagnetically coupled and fixed such that their magnetization directions are opposite to each other.

The outer, and the inner layer is preferably formed of, for instance, a $Co_{70}Fe_{30}$ (at %) alloy layer. The outer layer has a thickness of preferably about 3 to 7 nm, and the inner layer has a thickness of preferably about 3 to 10 nm. The nonmagnetic intermediate layer, for instance, is made of a nonmagnetic material containing at least one selected from the group consisting of Ru, Rh, Ir, Re, Cr, Zr and Cu, and has a thickness of, for instance, about 0.35 to 1.0 nm. The nonmagnetic intermediate layer is provided to fix the magnetization of the inner layer and the magnetization of the outer layer in mutually opposite directions.

(Explanation of the Free Layer 50 and Cap Layer 26)

The free layer 50 has its magnetization direction changing depending on an external magnetic field, i.e., a magnetic field from the recording medium, and is formed of a ferromagnetic layer (soft magnetic layer) having a small coercive force. The free layer 50 has a thickness of, for instance, about 2 to 10 nm, and may be in either a single layer form or a multilayer form including a plurality of ferromagnetic layers.

As shown in FIG. 1, there is the cap (protective) layer 26 formed on the free layer 50. The cap layer 26, for instance, is formed of a Ta or Ru layer, and has a thickness of about 0.5 to 20 nm.

(Explanation of the Nonmagnetic Layer 40)

The CPP-MR device 5 here is represented by the so-called CPP-GMR device and TMR device. For this reason, the nonmagnetic layer 40, for instance, is made of one material selected from the group consisting of $Al_2O_x$, MgO, Cu, ZnO, $TiO_x$, $SiO_2$, $HfO_x$, and $ZrO_x$, and has a thickness of about 1.0 to 2.0 nm.

(Explanation of the Antiferromagnetic Layer 22)

The antiferromagnetic layer 22 functioning as the pinning layer works such that by way of exchange coupling with the fixed magnetization layer 30 as described above, the magnetization direction of the fixed magnetization layer 30 is fixed.

For instance, the antiferromagnetic layer 22 is made of an antiferromagnetic material containing at least one element M' selected from the group of Pt, Ru, Rh, Pd, Ni, Cu, Ir, Cr and Fe, and Mn. The content of Mn is preferably 35 to 95 at %. The antiferromagnetic material is broken down into two types: (1) a non-heat treatment type antiferromagnetic material that shows anti-ferromagnetism even in the absence of heat treatment to induce an exchange coupling magnetic field between it and a ferromagnetic material, and (2) a heat treatment type antiferromagnetic material that is going to show anti-ferromagnetism by heat treatment. In the invention, both types (1) and (2) may be used without restriction. For instance, the non-heat treatment type antiferromagnetic material is exemplified by RuRhMn, FeMn, and IrMn, and the heat treatment type antiferromagnetic material is exemplified by PtMn, NiMn, and PtRhMn.

The antiferromagnetic layer 22 has a thickness of about 5 to 30 nm.

It is here noted that for the layer for fixing the magnetization direction of the fixed magnetization layer 30, it is acceptable to use a hard magnetic layer comprising a hard magnetic material such as CoPt in place of the aforesaid antiferromagnetic layer.

The underlay layer 21 formed below the anti-ferromagnetic layer 22 is provided to improve the crystallization and orientation of each of the layers stacked on it in general, and the exchange coupling of the antiferromagnetic layer 22 and the fixed magnetization layer 30 in particular. For such underlay layer 21, for instance, a multilayer of Ta and NiFe layers or Ta and NiCr layers is used. The underlay layer 21 has a thickness of about 2 to 6 nm as an example.

Further, the insulating layer 4 shown in FIG. 1 is made of, for instance, alumina. For the bias magnetic field-applying layers 6, for instance, a hard magnetic layer (hard magnet) or a multilayer structure of a ferromagnetic layer and an antiferromagnetic layer may be used, and there is the specific mention of CoPt or CoCrPt.

(Explanation of Part of the Invention)

The essential part of the thin-film magnetic head of the invention is that in the head there is a re-magnetizer unit 70 provided that, when the bias magnetic field-applying layer 6 degrades and malfunctions, is operable to re-magnetize that bias magnetic field-applying layer for getting its function back to normal, as shown in FIG. 2.

As shown in FIG. 2, the re-magnetizer unit 70 is built up of a stack of diodes 71 (three diodes 71 in the illustrated embodiment). And then, as a voltage greater than the diode operating voltage (the threshold value) is applied between the upper shield layer 8 and the lower shield layer 3, it permits currents to pass through the diodes, thereby generating a magnetic field that is in turn operable to re-magnetize the bias magnetic field-applying layer 6.

A model illustrative of how the re-magnetizer unit is in operation is depicted in FIG. 3. A model designed to pass two currents in association with two bias magnetic field-applying layers 6 is depicted in FIG. 4. The model of FIG. 4 is identical in operating voltage with the model of FIG. 3. Accordingly, the model of FIG. 4 makes sure more efficient re-magnetization because of being capable of applying a magnetic field closer to the bias magnetic field-applying layers 6.

The magnetic field necessary for the re-magnetization of the bias magnetic field-applying layer 6 should preferably be at least 1.2 KOe in general and at least 1.5 KOe in particular. Referring here to an electromagnetic circuit to generate the magnetic field necessary for re-magnetization, the relation of the distance (r) up to the bias magnetic field-applying layer 6 vs. the current value (I) may as well be predetermined via experimentation.

Each diode 71 used at the re-magnetizer unit 70 is an electronic device that has two electrodes, shows performance not pursuant to Ohm's law, and is used for rectifiers or the like. There is the mention of a pn junction diode harnessing pn junction, a Schottky diode harnessing metal/semiconductor contact, a Zener diode harnessing a junction breakdown, or the like.

In the invention, insofar as the structure of the reproducing head is concerned, the specific site (position) at which the diode 71 is located within the magnetic head is generally broken down to the following two.

(1) First Embodiment

In the first embodiment of the invention, the first position at which the diode 71 may be formed is provided by a position between the upper shield layer 8 and the lower shield layer 3 and in the rear of the aforesaid magneto-resistive effect device 5.

The merit in this case is that the diode 71 is inserted between the upper shield layer 8 and the lower shield layer 3, and so the multilayer structure for it can be simplified and it interferes less with the magneto-resistive effect device.

The demerit is, however, that there is some restriction on the type of the diode that may be formed, because due to the presence of the magneto-resistive effect device 5, any process step implemented at a higher temperature exceeding 300° C. is impossible at the time of forming the diode. Basically, the usable diode is limited to Schottky diodes, and planar PN diodes using In or the like as a dopant.

In the rear of the magneto-resistive effect device 5 shown in FIG. 2, there is usually a refilled insulation layer provided, which is in contact with the rear end face of the device 5 and extends rearward. By this refilled insulation layer, the diode 71 is electrically insulated from the device 5 at a position except the upper and lower shields 3 and 8.

(2) Second Embodiment

In the second embodiment of the invention, the second position at which the diode 71 may be formed is found below the lower shield layer 3.

In this case, the substantial formation of the diode 71 takes place prior to the formation of the magneto-resistive effect device 5; there is a merit of permitting a high-temperature process step (in the range of, for instance, 300 to 1,000° C.) to be adopted for diode formation. Another merit is that less restrictions on the thickness direction makes sure a high flexibility in the choice of structure and fabrication. However, the structure and fabrication process of the re-magnetizer unit (diode) are a lot more complicated. Another demerit is the need of tweaking the leading of electrodes. That is to say, the feature of the second embodiment is that a metal film called a reset lead is located at a place where the diode of the first embodiment is located, so that the bias magnetic field-applying layer 6 is re-magnetized by a magnetic field created by a current flowing through that lead.

In this second embodiment, ordinary PN junction diodes, Zener diodes, avalanche diodes, etc. may be used in addition to Schottky diodes.

For one example of the fabrication process in the second embodiment, see the examples given below.

(Explanation of the Whole Construction of the Thin-film Magnetic Head)

The whole construction of the thin-film magnetic head comprising the aforesaid magneto-resistive effect device is now explained.

Figure 5:
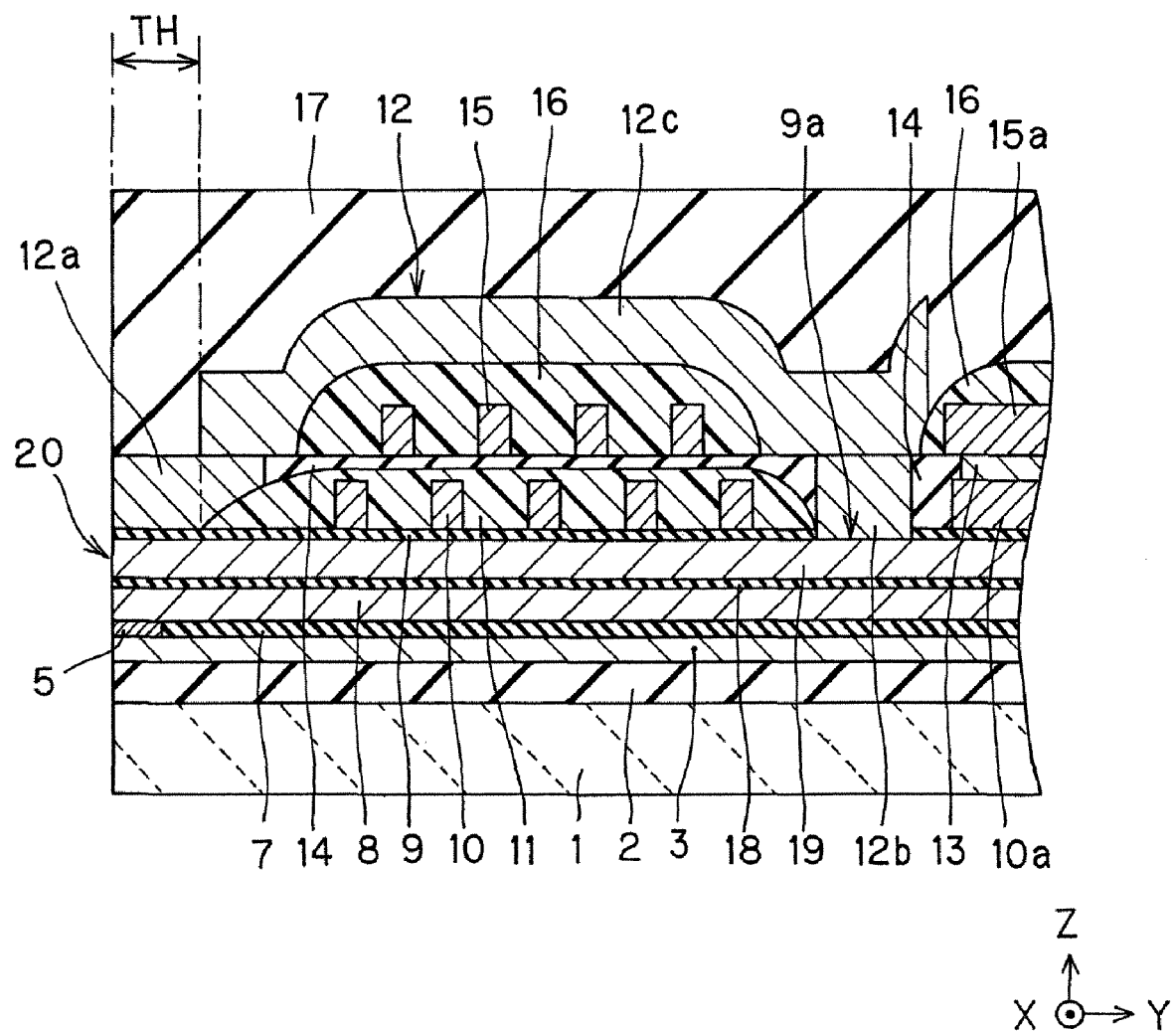
FIG. 5 is illustrative of the construction of the thin-film magnetic head according to one preferable embodiment of the invention; it is a sectional view illustrative of a section of the thin-film magnetic head perpendicular to the medium opposite plane and the substrate.
Figure 6:
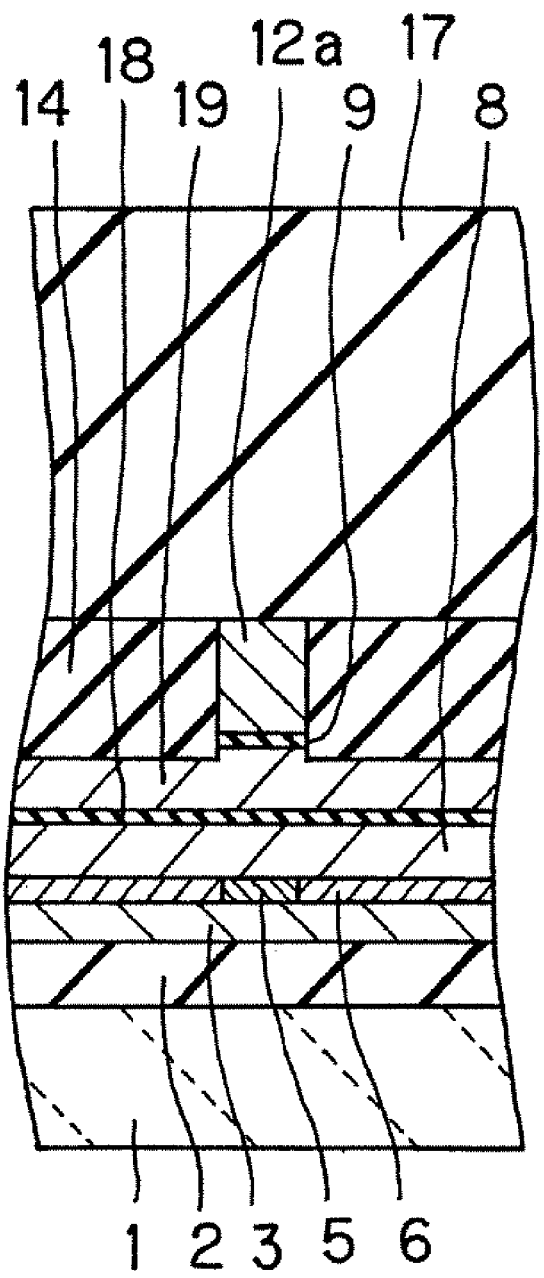
FIG. 6 is illustrative of the construction of the thin-film magnetic head according to one preferable embodiment of the invention; it is illustrative of a section of the magnetic pole portion of the thin-film magnetic head parallel with the medium opposite plane.
Figure 6:
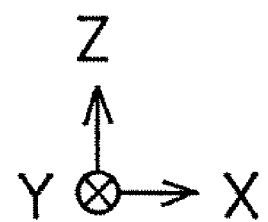

FIGS. 5 and 6 are illustrative of the whole construction of the thin-film magnetic head according to one preferred embodiment of the invention; FIG. 5 is illustrative of a section of the thin-film magnetic head perpendicular to the ABS and a substrate, and FIG. 6 is illustrative of a section of a magnetic pole portion of the thin-film magnetic head parallel with the ABS.

The whole structure of the thin-film magnetic head would be better understood when consideration is given to its fabrication process steps; the whole structure of the thin-film magnetic head is now explained with reference to its fabrication process steps.

First of all, the insulating layer 2 comprising an insulating material such as alumina ($Al_2O_3$) or silicon dioxide ($SiO_2$) is formed by sputtering or like techniques on a substrate 1 comprising a ceramic material such as AlTiC ($Al_2O_3$.TiC). That insulating layer has a thickness of typically about 0.5 to 20 μm.

Then, the lower shield layer 3 comprising a magnetic material and adapted for a reproducing head is formed on that insulating layer 2. The shield layer 3 has a thickness of typically about 0.1 to 5 μm. The magnetic material used for such lower shield layer 3, for instance, includes FeAlSi, NiFe, CoFe, CoFeNi, FeN, FeZrN, FeTaN, CoZrNb, and CoZrTa. The lower shield layer 3 is formed by sputtering, plating or like other techniques.

Then, the reproducing CPP-GMR device 5 is formed on the lower shield layer 3.

Although not shown, an insulating film (that is on a par with the insulating film 4 of FIG. 1) is then formed in such a way as to cover the two sides of the CPP-GMR device 5 and the upper surface of the first shield layer 3. The insulating film is formed of an insulating material such as alumina.

Then, the two bias magnetic field-applying layers 6 are formed in such a way as to be adjacent to the two sides of the CPP-GMR device 5 via the insulating layer. After the formation of the lower shield layer 3, for instance, the re-magnetizer unit 70 in the first embodiment—part of the invention—is formed at a position in the rear of the device 5 (not shown in FIGS. 5 and 6; so see FIG. 2).

Then, the refilled insulation layer 7 is formed in such a way as to be located around the CPP-GMR device 5 and bias magnetic field-applying layers 6. By this refilled insulation layer 7, the re-magnetizer unit 70 in the first embodiment—part of the invention—is electrically insulated except where there are the upper and lower shields 3 and 8.

Then, the second shield layer 8 for the reproducing head, comprising a magnetic material, is formed on the CPP-GMR device 5, bias magnetic field-applying layers 6, re-magnetizer unit 70 and refilled insulation layer 7. The second shield layer 8, for instance, is formed by means of plating or sputtering.

Then, the separation layer 18 comprising an insulating material such as alumina is formed by sputtering or the like on the upper shield layer 8. Then, the lower magnetic pole layer 19, comprising a magnetic material and adapted for a recording head, is formed by plating, sputtering or the like on the separation layer 18. The magnetic material used for the second shield layer 8, and the lower magnetic pole layer 19, for instance, includes a soft magnetic material such as NiFe, CoFe, CoFeNi, and FeN. It is here noted that instead of the multilayer arrangement of the second shield layer 8, separation layer 18 and lower magnetic pole layer 19, it is acceptable to configure the second shield layer in such a way as to work also as a lower electrode layer.

Then, the recording gap layer 9 comprising a non-magnetic material such as alumina is formed by sputtering or the like on the lower magnetic pole layer 19. That recording gap layer has a thickness of about 50 to 300 nm.

For the formation of a magnetic path, the recording gap layer 9 is then partially etched at the center of the thin-film coil to be described later to form a contact hole 9a.

Then, the first layer portion 10 of the thin-film coil, typically comprising copper (Cu), is formed on the recording gap layer 9 at a thickness of typically 2 to 3 μm. In FIG. 5, note that reference numeral 10a stands for a connector portion of the first layer portion 10, which is to be connected to the second layer portion 15 of the thin-film coil to be described later. The first layer portion 10 is wound around the contact hole 9a.

Then, the insulating layer 11 comprising a photo-resist or other organic material having fluidity upon heating is formed in such a given pattern as to cover the first layer portion 10 of the thin-film coil and the surrounding recording gap layer 9.

Then, the insulating layer 11 is heat treated at a given temperature to make its surface flat. By this heat treatment, each of the edge portions of the outer and inner peripheries of the insulating layer 11 is configured into a rounded slant.

Then, in an area of the insulating layer 11 from a slant portion on the medium opposite plane 20 (to be described later) side to the medium opposite plane 20 side, a track width-setting layer 12a of an upper magnetic pole layer 12 is formed on the recording gap layer 9 and insulating layer 11, using the magnetic material for the recording head. The upper magnetic pole layer 12 is made up of that track width-setting layer 12a, and a coupler portion layer 12b and a yoke portion layer 12c to be described later.

The track width-setting layer 12a is formed on the recording gap layer 9, including an end portion that provides a magnetic pole portion of the upper magnetic pole layer 12 and a connector portion that is formed on the slant portion of the insulating layer 11 on the medium opposite plane 20 side and connected to the yoke portion layer 12c. The width of that end portion is set equal to the recording track width, and the width of the connector portion is greater than the width of the end portion.

Simultaneously with the formation of the track width-setting layer 12a, the coupler portion 12b comprising a magnetic material is formed on the contact hole 9a and a connector layer 13 comprising a magnetic material is formed on the connector portion 10a. The coupler portion layer 12b forms a portion of the upper magnetic pole layer 12, which is to be magnetically connected to the upper shield layer 8.

Figure 9:
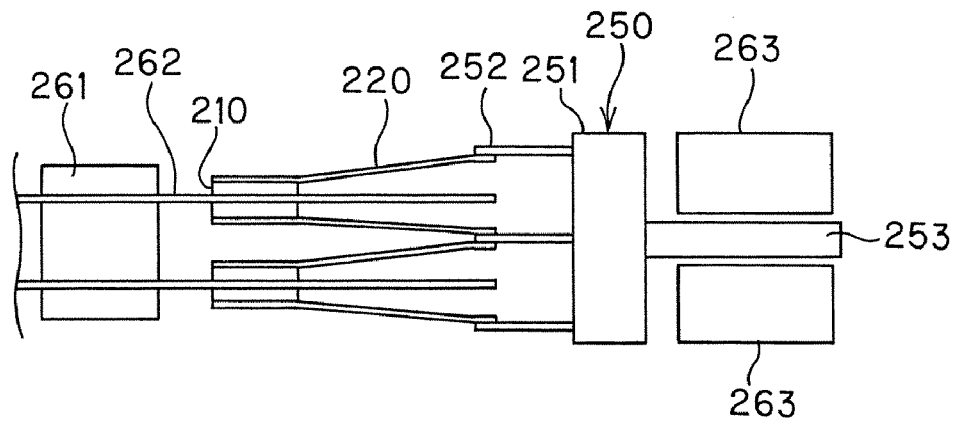
FIG. 9 is illustrative of part of the magnetic disk system according to one embodiment of the invention.

Then, magnetic pole trimming is carried out. That is, in an area around the track width-setting layer 12a, the track width-setting layer 12a is used as a mask to etch at least a part of the recording gap layer 9 and the magnetic pole portion of the upper shield layer 8 on the recording gap layer 9 side, whereby, as shown in FIG. 9, there is a trim structure formed, in which at least a part of the magnetic pole portion of the upper magnetic pole layer 12, the recording gap layer 9 and the magnetic pole portion of the upper shield layer 8 has a uniform width. This trim structure makes sure prevention of an effective increase in the track width due to the spread of a magnetic flux near the recording gap layer 9.

Then, an insulating layer 14 comprising alumina or other inorganic insulating material is formed around the whole at a thickness of typically 3 to 4 μm.

Then, that insulating layer 14 is polished by chemo-mechanical polishing or the like as far as the surfaces of the track width-setting layer 12a, coupler portion layer 12b and connector layer 13 for flattening.

Then, the second layer portion 15 of the thin-film coil typically comprising copper (Cu) is formed on the flattened insulating layer 14 at a thickness of typically 2 to 3 μm. In FIG. 5, note that reference numeral 15a is indicative of a connector portion of the second layer portion 15, which is to be connected to the connector portion 10a of the first layer portion 10 of the thin-film coil by way of the connector layer 13. The second layer portion 15 is wound around the coupler portion 12b.

Then, an insulating layer 16 comprising a photo-resist or other organic material having fluidity upon heating is formed in such a given pattern as to cover the second layer portion 15 of the thin-film coil and the surrounding insulating layer 14.

Then, the insulating layer 16 is heat treated at a given temperature to make its surface flat. By this heat treatment, each of the edge portions of the outer and inner peripheries of the insulating layer 16 is configured into a rounded slant.

Then, the magnetic material for the recording head such as permalloy is used to form the yoke portion layer 12c forming the yoke portion of the upper magnetic layer 12 on the track width-setting layer 12a, insulating layers 14, 16 and coupler portion layer 12b. An end of the yoke layer portion 12c on the medium opposite plane 20 side is spaced away from the medium opposite plane 20, and the yoke portion layer 12c is connected to the lower magnetic pole layer 19 by way of the coupler portion layer 12b.

Then, an overcoat layer 17 typically comprising alumina is formed in such a way as to cover the whole. Finally, a slider including the aforesaid respective layers is machined to form the medium opposite plane 20 of the thin-film head including the recording head and reproducing head in the form of a complete thin-film magnetic head.

The thus fabricated thin-film magnetic head comprises the medium opposite plane 20 in opposition to the recording medium, the aforesaid reproducing head and the recording head.

The recording head comprises the magnetic lower and upper magnetic pole layers 19 and 12 that include mutually opposite magnetic pole portions on the medium opposite plane 20 side and are magnetically coupled to each other, the recording gap layer 9 located between the magnetic pole portion of the lower magnetic pole layer 19 and the magnetic pole portion of the upper magnetic pole layer 12, and the thin films 10, 15 at least a part of which is located between the lower 19 and the upper magnetic pole layer 12 while insulated from them.

As shown in FIG. 5, such a thin-film magnetic head has a throat height (indicated by TH in the drawing) that is defined by a length from the medium opposite plane 20 up to the end of the insulating layer 11 on the medium opposite plane side. In other words, the "throat height" means a length (height) from the medium opposite plane 20 to a position at which the two magnetic pole layers start being spaced away.

(Explanation of how the Thin-film Magnetic Head Works)

How the thin-film magnetic head according to the embodiment here works is now explained. The thin-film magnetic head records information in the recording medium by the recording head, and plays back the information recorded in the recording medium by the reproducing head.

At the reproducing head, the direction of a bias magnetic field applied by the bias magnetic field-applying layers 6 is orthogonal to the direction perpendicular to the medium opposite plane 20. At the CPP-MR device 5 with no signal magnetic field applied yet, the magnetization direction of the free layer 50 lies in alignment with the direction of the bias magnetic field, and the magnetization direction of the fixed magnetization layer 30 is fixed in the direction perpendicular to the medium opposite plane 20.

At the CPP-MR device 5, there is a change in the magnetization direction of the free layer 50 depending on a magnetic field from the recording medium, which in turn causes a change in the relative angle between the magnetization direction of the free layer 50 and the magnetization direction of the fixed magnetization layer 30, with the result that there is a change in the resistance value of the CPP-MR device 5. The resistance value of the CPP-MR device 5 may be found from a potential difference between the first and second shield layers, i.e., the two electrode layers 3 and 8 at the time when the sense current is passed through the MR device. It is thus possible for the reproducing head to play back the information recorded in the recording medium.

(Explanation of the Operation Control of the Re-magnetizer Unit 70—Part of the Invention)

Figure 11:
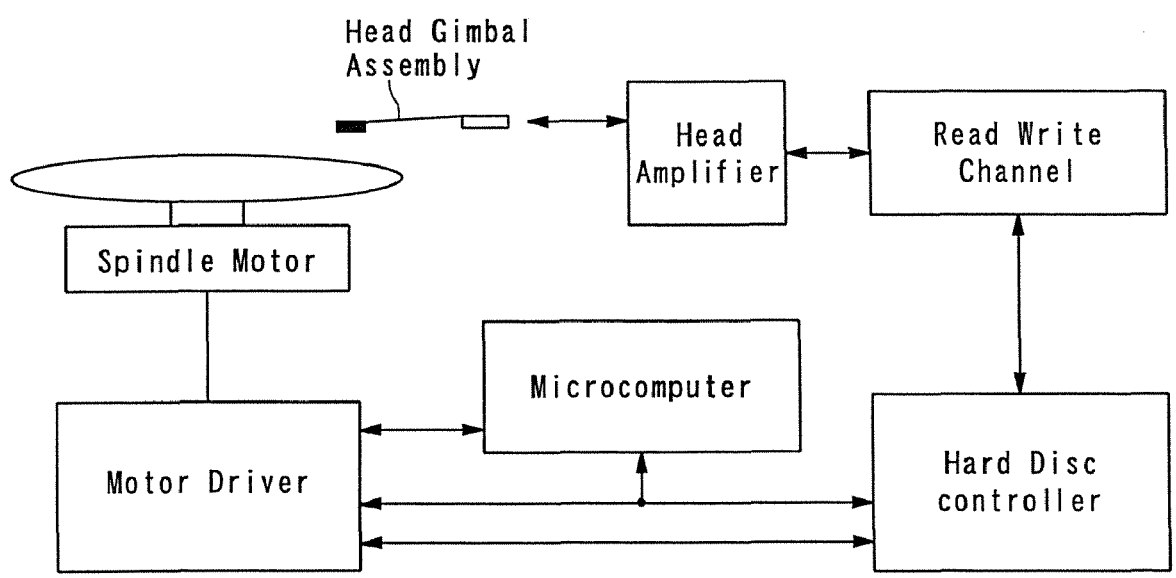
FIG. 11 is illustrative in schematic of one example of the circuit diagram of a hard disk drive system (HDD).
Figure 12:
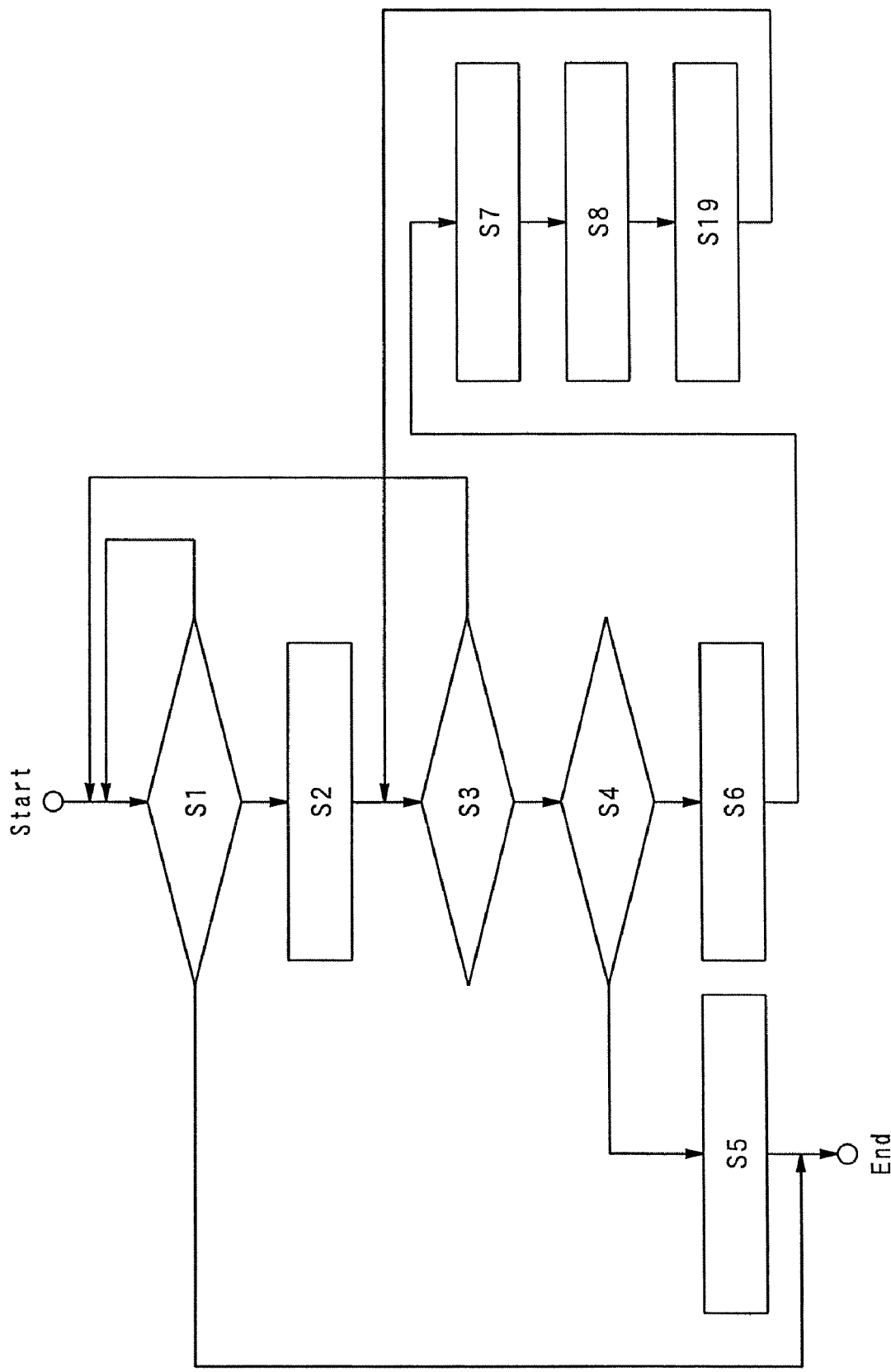
FIG. 12 is a flowchart illustrating the operation of the re-magnetizer unit.

Control is implemented according to such a flowchart as shown in FIG. 12, for instance, on the basis of a circuit diagram for such a hard disk drive (HDD) as depicted in FIG. 11.

At step 1 (S1) shown in FIG. 12, an error rate is monitored. When it is judged that the error rate increases to such a degree that the CPP-MR device 5 degrades, the job goes to step (S2).

At step 2 (S2), hard disk drive processing other than the re-magnetization of the bias magnetic field-applying layer 6, for instance, the reading of data is retried.

At step 3 (S3), it is judged whether or not the error rate gets back to normal as a consequence of the processing at step 2 (S2). When the error rate is not back to normal, the job goes to step 4 (S4).

At step 4 (S4), it is judged whether or not the try of re-magnetization processing gets finished. If so, the job goes to step 5 (S5) where the restoration of the error rate is judged as unfeasible: the job comes to an end (END). If not, the job goes to step 6 (S6) where re-magnetization processing is set off. In other words, step 6 (S6) goes over to step 7 (Step 7) where the bias voltage of the magnetic head is boosted up to a voltage where the diode 71 at the re-magnetizer unit 70 is in operation. For instance, the bias voltage is brought from 150 mV up to 300 mV. This boosting processing takes place for a given time (of, for instance, a few msec. to a few minutes) (step 8 (S8)). Thereafter, the job goes to step 9 (S9) where the bias voltage of the magnetic head goes back to normal; for instance, it is brought from 300 mV down to a normal 150 mV. Once such re-magnetization processing has been over, the job goes back to step 3 (S3) where whether or not the error rate gets back to normal is judged.

(Explanation of the Head Gimbal Assembly and the Magnetic Disk System)

The head gimbal assembly and the magnetic disk system according to the embodiment here are now explained.

A slider 210 included in the head gimbal assembly is first explained with reference to FIG. 7. In the magnetic disk system, the slider 210 is located in such a way as to face a hard disk that is a rotationally driven disk-form recording medium. This slider 210 primarily comprises a substrate 211 built up of a substrate 1 and an overcoat 17 depicted in FIG. 5.

The substrate 211 is in a generally hexahedral shape. Of the six surfaces of the substrate 211, one surface is in opposition to the hard disk. On that one surface there is a medium opposite plane 20 formed.

Figure 7:
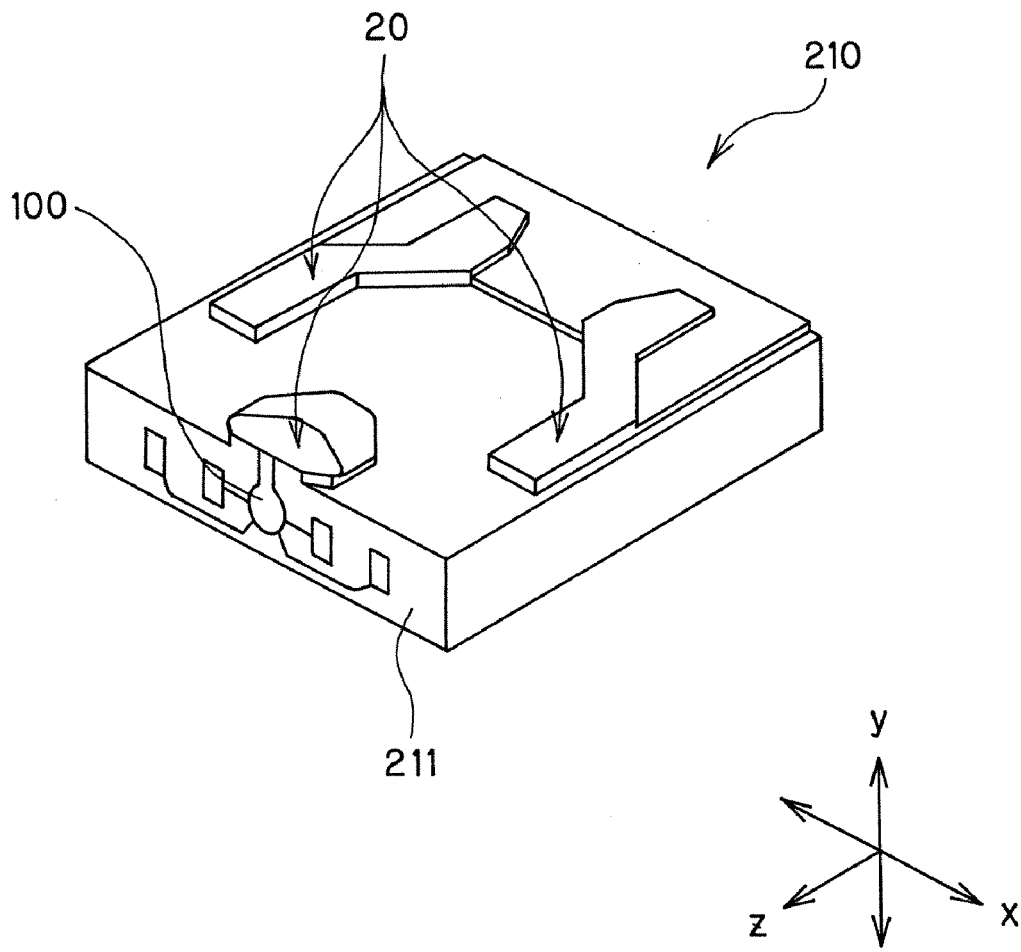
FIG. 7 is a perspective view of a slider built in the head gimbal assembly according to one embodiment of the invention.

As the hard disk rotates in the z-direction in FIG. 7, it causes an air flow passing between the hard disk and the slider 210 to induce lift in the downward y-direction in FIG. 7. This lift in turn causes the slider 210 to levitate over the surface of the hard disk. Note here that the x-direction in FIG. 7 traverses tracks on the hard disk.

Near the end of the slider 210 on an air exit side (the left lower end in FIG. 7), there is the thin-film magnetic head 100 formed according to the embodiment here.

A head gimbal assembly 220 according to this embodiment is now explained with reference to FIG. 8. The head gimbal assembly 220 comprises a slider 210 and a suspension 221 adapted to resiliently support that slider 210. The suspension 221 comprises a leaf spring-form load beam 222 formed typically of stainless steel, a flexure 223 attached to one end of the load beam 222 and having the slider 210 joined to it for giving a suitable degree of flexibility to the slider 210, and a base plate 224 attached to the other end of the load beam 222.

The base plate 224 is adapted to be attached to an arm 230 of an actuator for moving the slider 210 in the track traverse direction x of the hard disk 262. The actuator comprises the arm 230 and a voice coil motor for driving that arm 230. At a portion of the flexure 223 having the slider 210 attached to it, there is a gimbal portion provided for keeping the posture of the slider 210 constant.

The head gimbal assembly 220 is attached to the arm 230 of the actuator. The head gimbal assembly 220 attached to one arm 230 is called a head arm assembly, whereas the head gimbal assembly 220 attached to a carriage at its plurality of arms is referred to as a head stack assembly.

Figure 8:
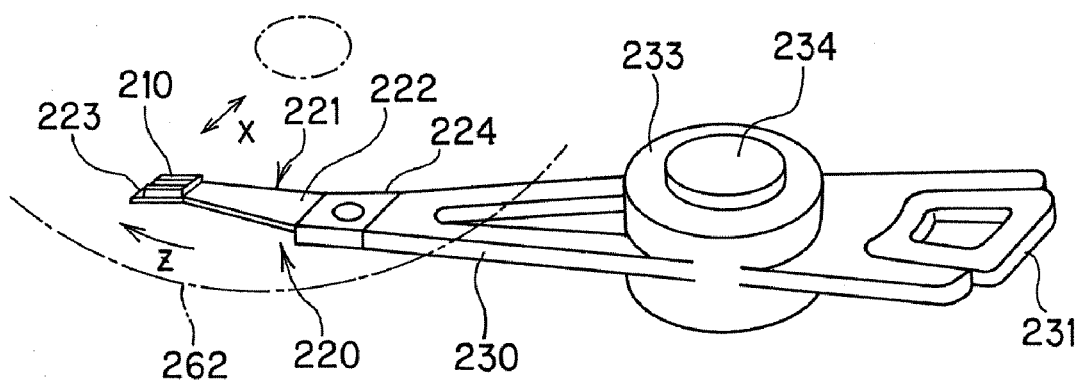
FIG. 8 is a perspective view of a head arm assembly including the head gimbal assembly according to one embodiment of the invention.

FIG. 8 illustrates one example of the head arm assembly, wherein the head gimbal assembly 220 is attached to one end of the arm 230. To the other end of the arm 230, a coil 231 forming a part of the voice coil motor is attached. Halfway across the arm 230, there is a bearing portion 233 attached to a shaft 234 adapted to support the arm 230 in a pivotal fashion.

One example of the head stack assembly and the magnetic disk system according to the instant embodiment are now explained with reference to FIGS. 9 and 10.

Figure 10:
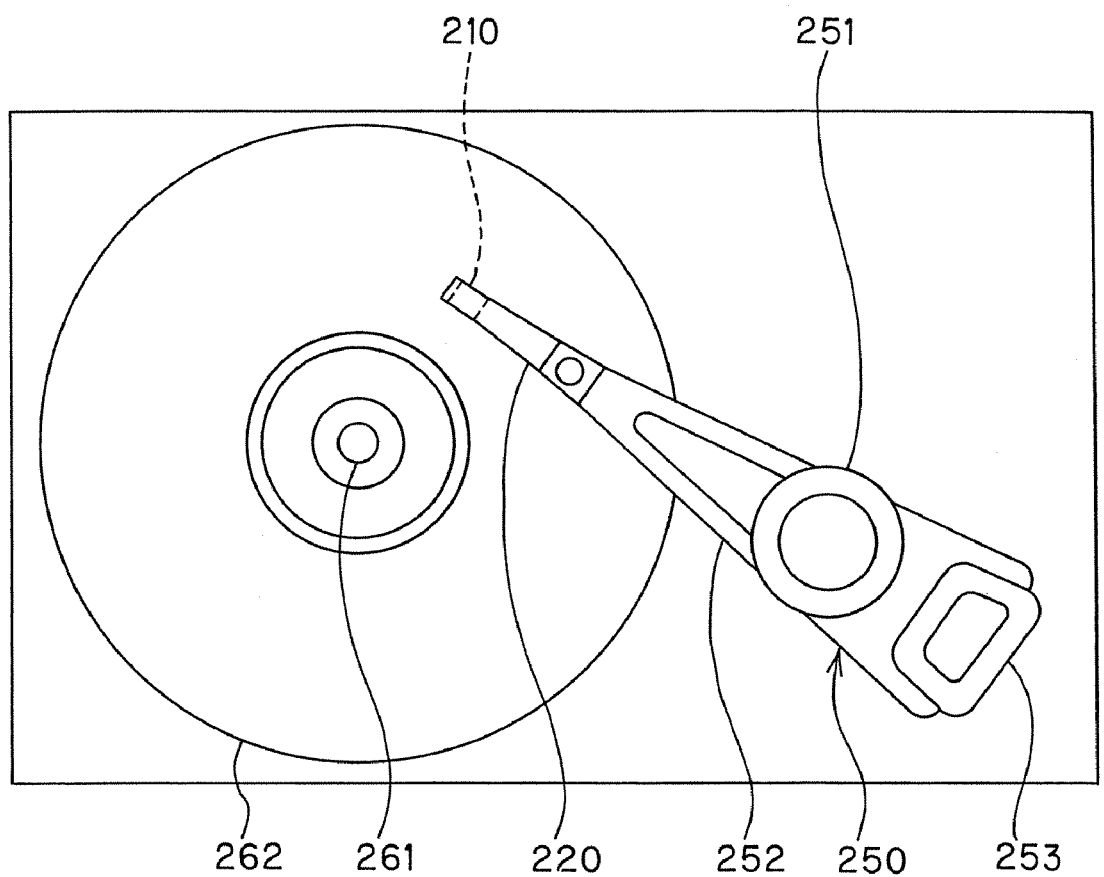
FIG. 10 is a plan view of the magnetic disk system according to one embodiment of the invention.

FIG. 9 is illustrative of part of the magnetic disk system, and FIG. 10 is a plan view of the magnetic disk system.

A head stack assembly 250 comprises a carriage 251 having a plurality of arms 252. The plurality of arms 252 are provided with a plurality of the head gimbal assemblies 220 such that they line up vertically at an interval. On the side of the carriage 251 that faces away from the arms 252, there is a coil 253 attached, which coil becomes a part of the voice coil motor. The head stack assembly 250 is incorporated in the magnetic disk system.

The magnetic disk system comprises a plurality of hard disks 262 attached to a spindle motor 261. For each hard disk 262, two sliders 210 are located such that they are opposite to each other with the hard disk 262 held between them. The voice coil motor has also permanent magnets 263 located at opposite positions with the coil 253 of the head stack assembly 250 held between them.

The head stack assembly 250 except the slider 210 and the actuator correspond to the positioning device here which is operable to support the slider 210 and position it relative to the hard disk 262.

With the magnetic disk system here, the actuator is actuated to move the slider 210 in the track traverse direction of the hard disk 262, thereby positioning the slider 210 with respect to the hard disk 262. The thin-film magnetic head incorporated in the slider 210 works such that information is recorded by a recording head in the hard disk 262, and the information recorded in the hard disk 262 is played back by a reproducing head.

The head gimbal assembly and the magnetic disk system here have pretty much the same action as the thin-film magnetic head according to the foregoing embodiment.

While the embodiment here has been described with reference to the thin-film magnetic head of the structure wherein the reproducing head is located on the substrate side and the recording head is stacked on the reproducing head, it is contemplated that that order of stacking could be reversed. When the thin-film magnetic head here is used as a read-only head, the recording head could be removed from it.

It is also contemplated that part of the invention may be applied not only to magnetic heads but also as a so-called thin-film magnetic field sensor adapted to detect a magnetic field.

EXPLANATION OF THE SPECIFIC EXPERIMENTAL EXAMPLES

The invention relating to the thin-film magnetic head having such a re-magnetizer unit (diodes) as described above is now explained in more details with reference to the following specific examples.

Experimental Example I

Preparation of the Thin-film Magnetic Head Having the Re-magnetizer Unit (Diodes)

The re-magnetizer unit (diodes) was actually formed below the lower shield layer 3 on the basis of the fabrication process shown in FIG. 13, FIGS. 14A to 14S and FIGS. 15A to 15S (the second embodiment).

Figure 13:
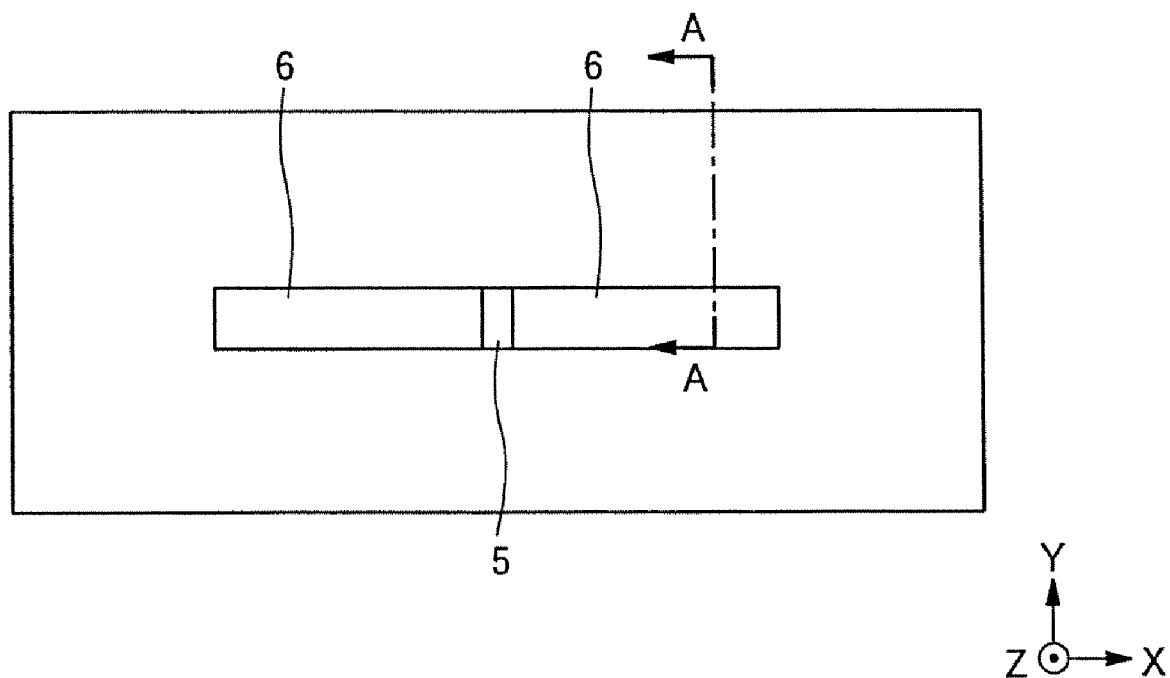
FIG. 13 is a plan view illustrative in schematic of in what relations the bias magnetic field-applying layer 6 and the CPP-MR device 5 are positioned.
Figure 15A:
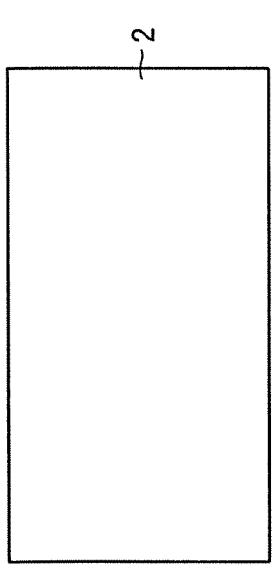
FIGS. 15A to 15S are plan views illustrative over time of the fabrication process.
Figure 15B:
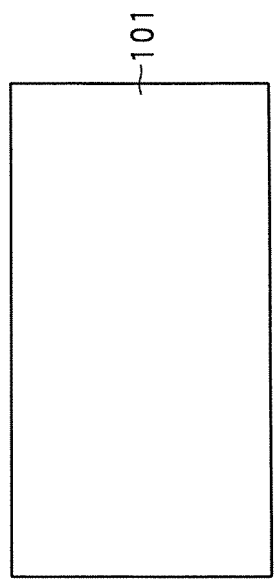
Figure 15C:
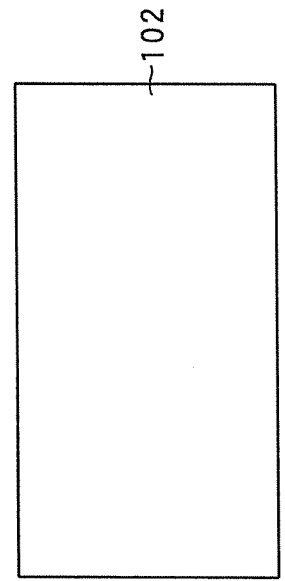
Figure 14A:
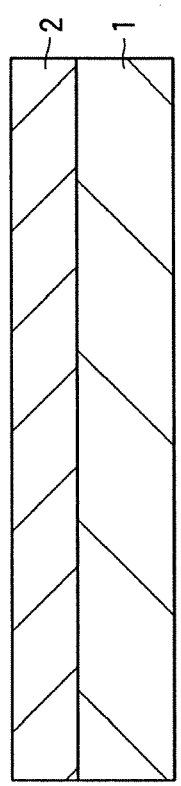
FIGS. 14A to 14S are illustrative over time of a fabrication process as taken on the arrowed line A-A of FIG. 13.
Figure 14B:
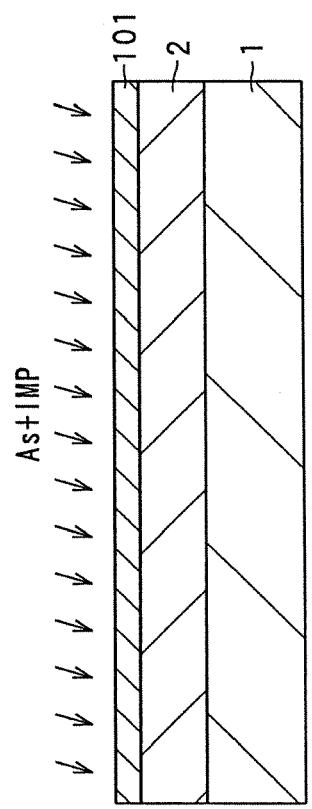
Figure 14C:
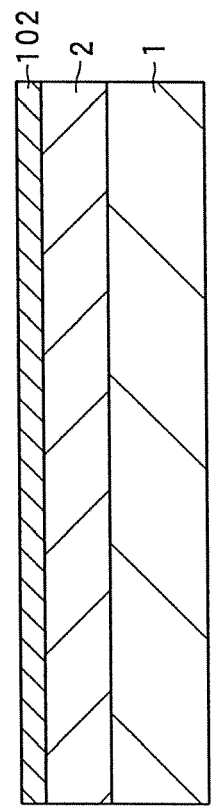

FIG. 13 is a plan view illustrative in schematic of what relations the bias magnetic field-applying layers 6 and the CPP-MR device 5 are located in. FIGS. 14A to 14S are sectional views as taken on arrowed line A-A in FIG. 13; they are illustrative over time of the fabrication process steps. In FIGS. 14A to 14S, however, note that for the purpose of providing a clear representation of the structure of part of the invention, the Y-axis direction scale is partly varied to partly exaggerate part of the invention. FIGS. 15A to 15S are plan views illustrative over time of the fabrication process steps. In FIGS. 14 and 15, the drawings with the same alphabet attached to them (for instance, FIG. 14A and FIG. 15A) are illustrative of the same process step.

Along the steps depicted in FIGS. 14A to 14S and FIGS. 15A to 15S, the thin-film magnetic head having the re-magnetizer unit (diodes) was prepared.

(1) FIG. 14A, FIG. 15A

The insulating layer 2 of $Al_2O_3$ in film form was formed on the substrate 1 composed of AlTiC.

(2) FIG. 14B, FIG. 15B

After the deposition film 101 of Si was formed on the insulating layer 2, implantation of As+ ions was carried out.

(3) FIG. 14C, FIG. 15C

While annealing was carried out at 800° C. to 1,000° C., the N+ Si layer 102 was formed. The film indicated at 101 was modified into the film indicated at 102.

(4) FIG. 14D, FIG. 15D

Photolithography was used with the photoresist 103 to prepare the opening 104 for the formation of a lead sensor portion.

(5) FIG. 14E, FIG. 15E

Dry etching was applied under the opening 104 for the formation of the lead sensor portion to remove the N+ Si layer 102 positioned under the opening 104.

(6) FIG. 14F, FIG. 15F

Figures 14D, 14E, 14F, 15D, 15E, 15F:
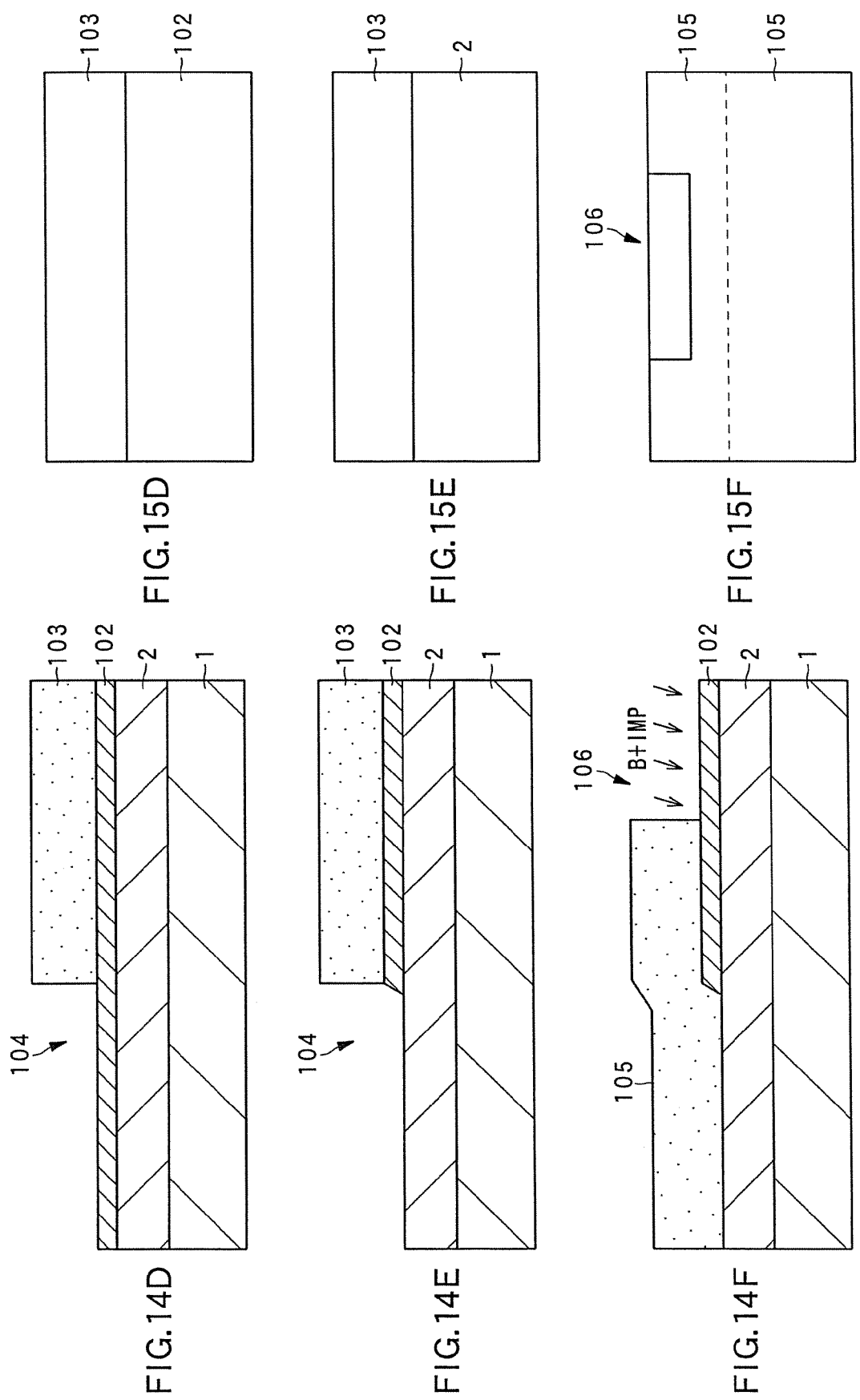
Figure 15G:
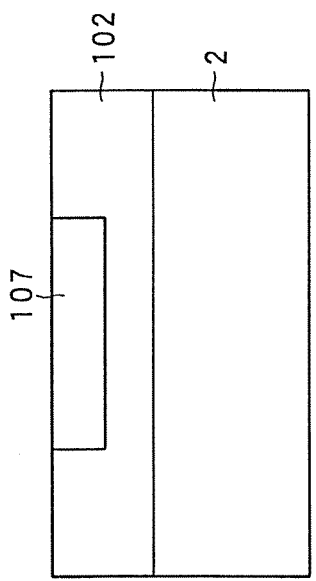
Figure 15H:
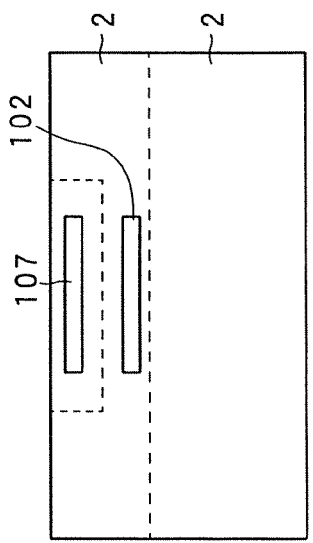
Figure 15I:
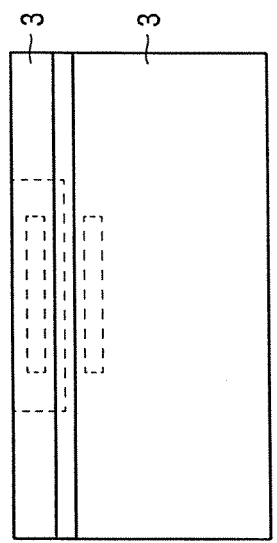
Figure 14G:
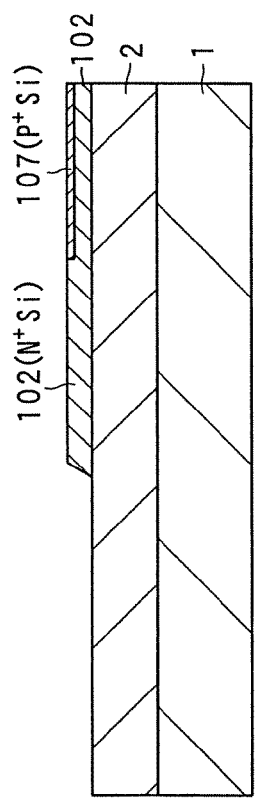
Figure 14H:
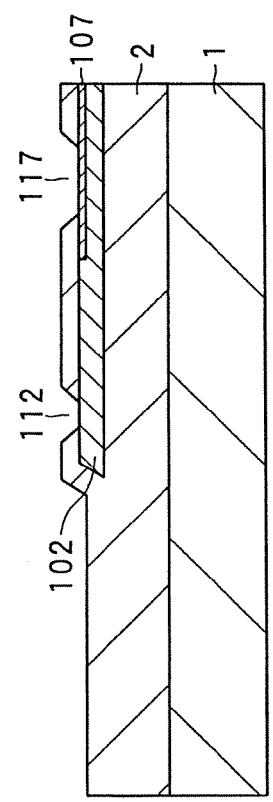
Figure 14I:
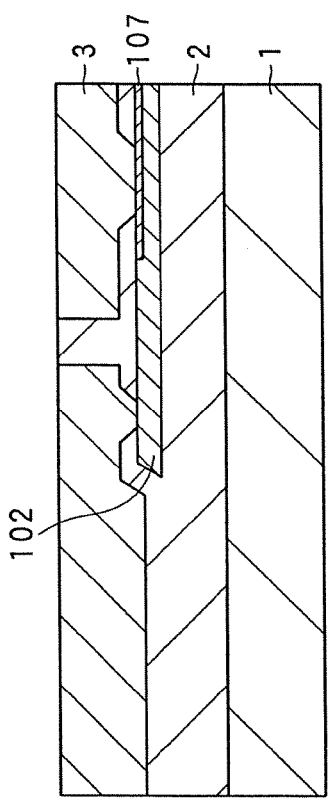
Figure 14J:
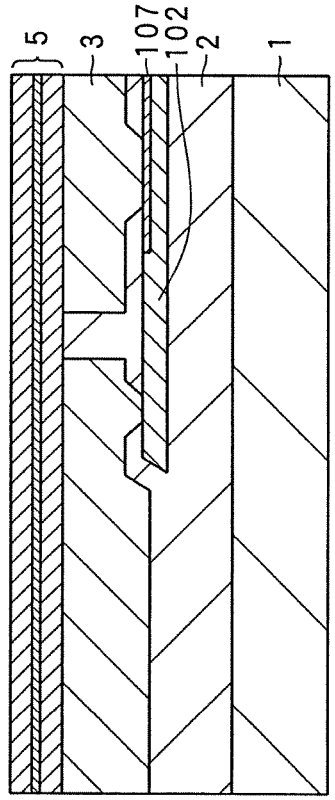
Figure 15J:
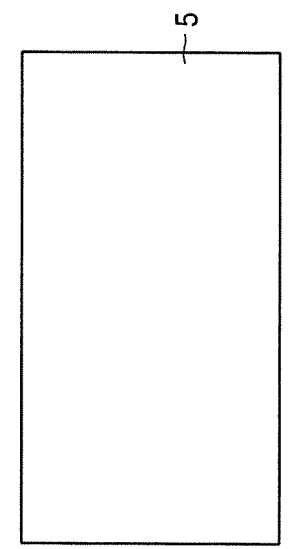
Figure 14K:
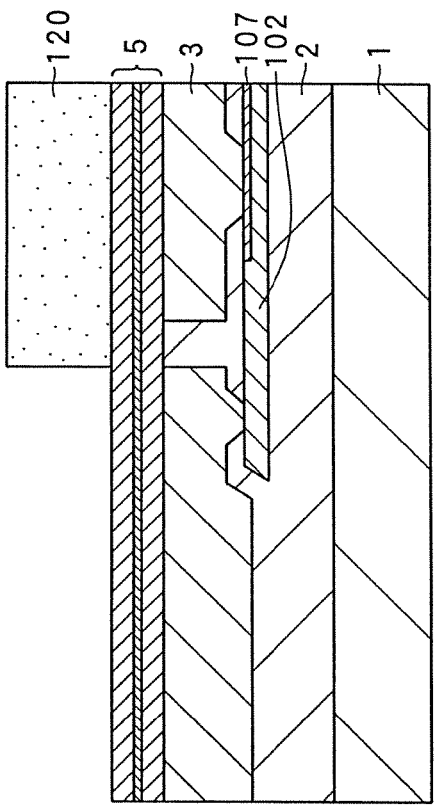
Figure 15K:
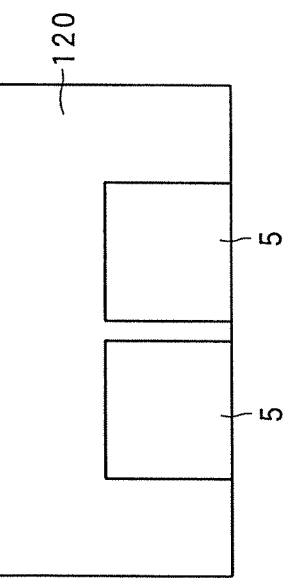
Figure 14R:
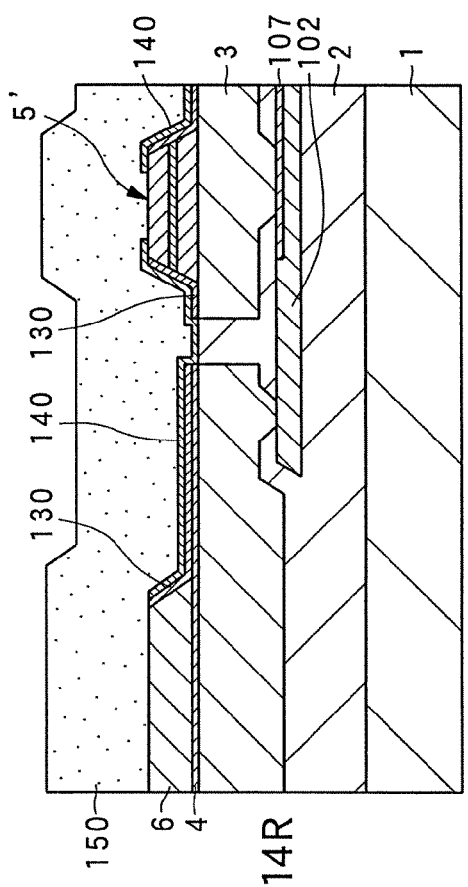
Figure 15R:
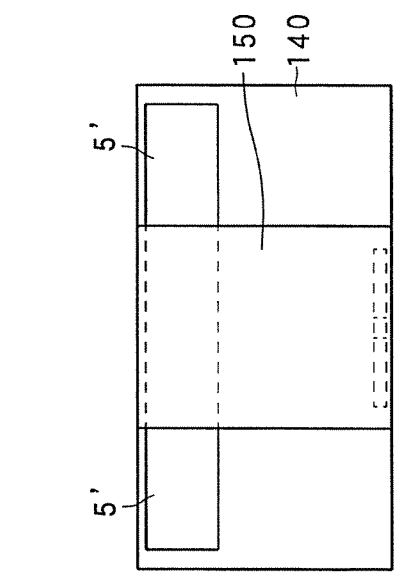
Figure 14S:
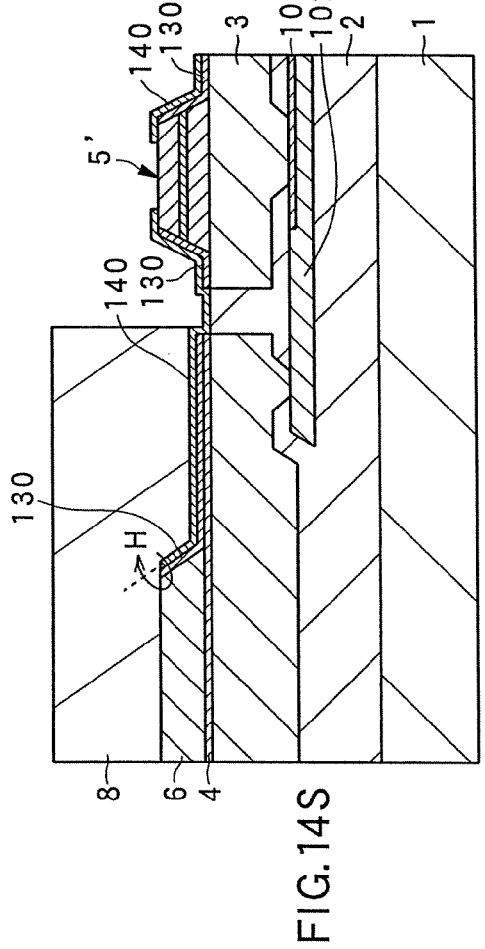
Figure 15S:
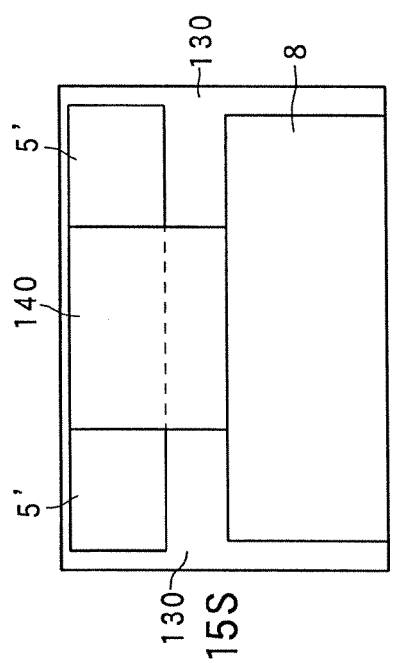

After removal of the photoresist 103 of FIG. 14E, the photoresist 105 for the formation of a P+ area was formed at the rear end. B+ ion plantation was carried out for the formation of the P+ area at a location of the opening 106.

(7) FIG. 14G, FIG. 15G

After the completion of B+ ion plantation, the photoresist 105 was removed off. While annealing was carried out at 800° C. to 1,000° C., the P+ Si layer 107 was formed.

(8) FIG. 14H, FIG. 15H

To bury a diode portion, the whole surface was covered with $Al_2O_3$, and area portions of the N+ Si layer 102 and P+

Si layer 107 were then ion milled to form openings 112 and 117, respectively.

(9) FIG. 14I, FIG. 15I

After the formation of the lower shield layer 3 in film form, gaps among the lower shield pattern were filled up with $Al_2O_3$, subsequently followed by flattening.

(10) FIG. 14J, FIG. 15J

The CPP-MR film 5 was stacked on the flattened lower shield layer 3. For CPP-MR film 5, a TMR film was used. Although the CPP-MR film 5 is shown simply as comprising a triple-layer structure, it is noted that the actual multilayer structure consisted of, in order from the lower shield layer 3 side, IrMn (antiferromagnetic layer 22), CoFe/Ru/CoFe (fixed magnetization layer 30), $Al_2O_3$ (non-magnetic layer 40) and CoFe (free layer 50).

(11) FIG. 14K, FIG. 15K

The photoresist 120 for the formation of the track on the CPP-MR film 5 and the formation of the bias magnetic field-applying layer 6 was formed into a given pattern.

(12) FIG. 14L, FIG. 15L

With the photoresist 120 as a mask, milling was carried out down to the lower shield 3. Then, the insulating layer 4 was deposited at a thickness of 2 to 20 nm in the opening formed by milling. Thereafter, the bias magnetic field-applying layers 6 were deposited on it, followed by removal of the photoresist 120.

(13) FIG. 14M, FIG. 15M

To form a stripe height for the CPP-MR film 5, photolithography was used to form a given pattern of photo-resist 125, 126.

(14) FIG. 14N, FIG. 15N

Using the photoresists 125, 126 as masks, etching for stripe height formation was carried out by ion milling.

(15) FIG. 14O, FIG. 15O

The insulating layer 130 was formed as an underlay layer for the reset lead.

(16) FIG. 14P, FIG. 15P

The reset lead 140 in film form was formed.

(17) FIG. 14Q, FIG. 15Q

The photoresists 125, 126 were removed off.

(18) FIG. 14R, FIG. 15R

Photolithography was used to form the photoresist 150 for removal of an unnecessary portion of the reset lead.

(19) FIG. 14S, FIG. 15S

Using the photoresist 150 as a mask, etching was down to the underlay insulating layer 130. That is, the unnecessary portion of the reset lead was removed off. Then, a given pattern of photoresist was formed, followed by the formation of the upper shield layer 8 by sputtering. By removal of the resist 150, the states of FIG. 14S and FIG. 15S turned up.

As the desired voltage was applied between the upper 8 and the lower shield layer 3, it permits currents to conduct through the reset lead 140. With currents flowing through the reset lead 140, such a magnetic field as depicted at H is generated, allowing for the re-magnetization operation of the bias magnetic field-applying layers 6 by this magnetic field H.

Experimental Example II

Experimentation for the Re-magnetization of the Bias Magnetic Field-applying Layers 6 Using the Re-magnetizer Unit (Diode)

Figure 16A:
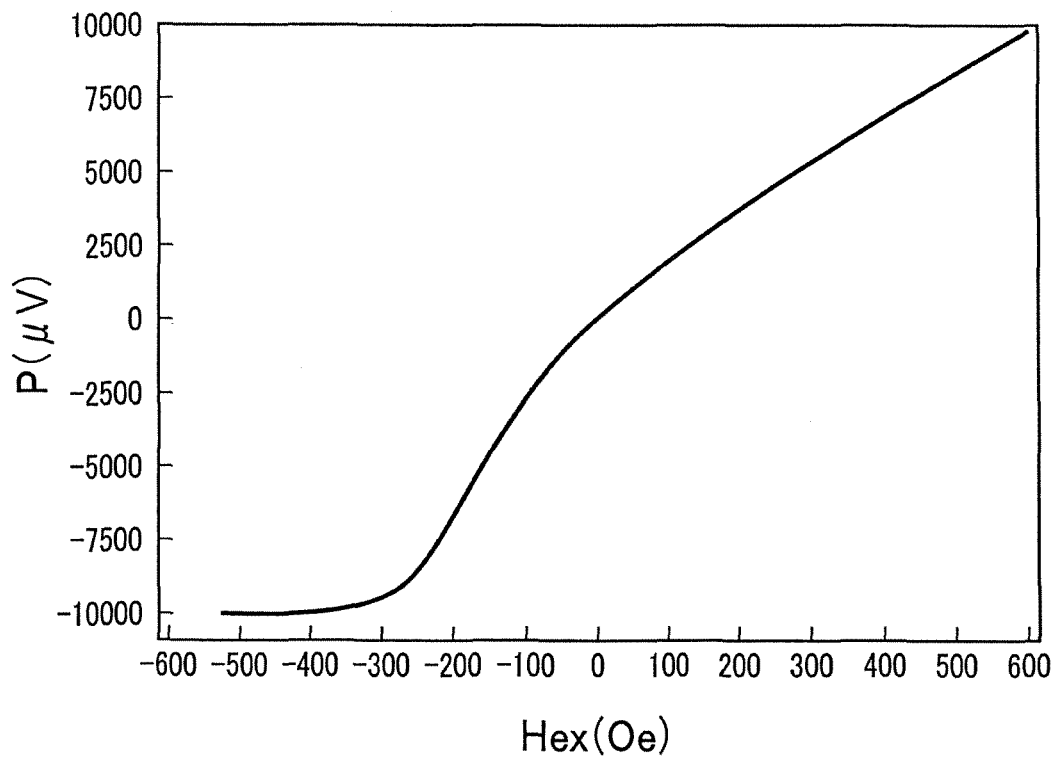
FIG. 16A is a graph indicative of the relation of the sensor output (P) vs. the externally applied magnetic field (Hex) of a degraded sample.

A sample with the bias magnetic field-applying layers 6 found to malfunction during the actual operation of a hard disk was chosen out of the samples prepared as described in Experimental Example I. FIG. 16A is indicative of the relations of sensor output (P) vs. externally applied magnetic field (Hex) of such a degraded sample. As for the samples with degraded bias magnetic field-applying layers 6, there is none of the linear relation of sensor output (P) vs. externally applied magnetic field (Hex), as can be seen from that graph.

Figure 16B:
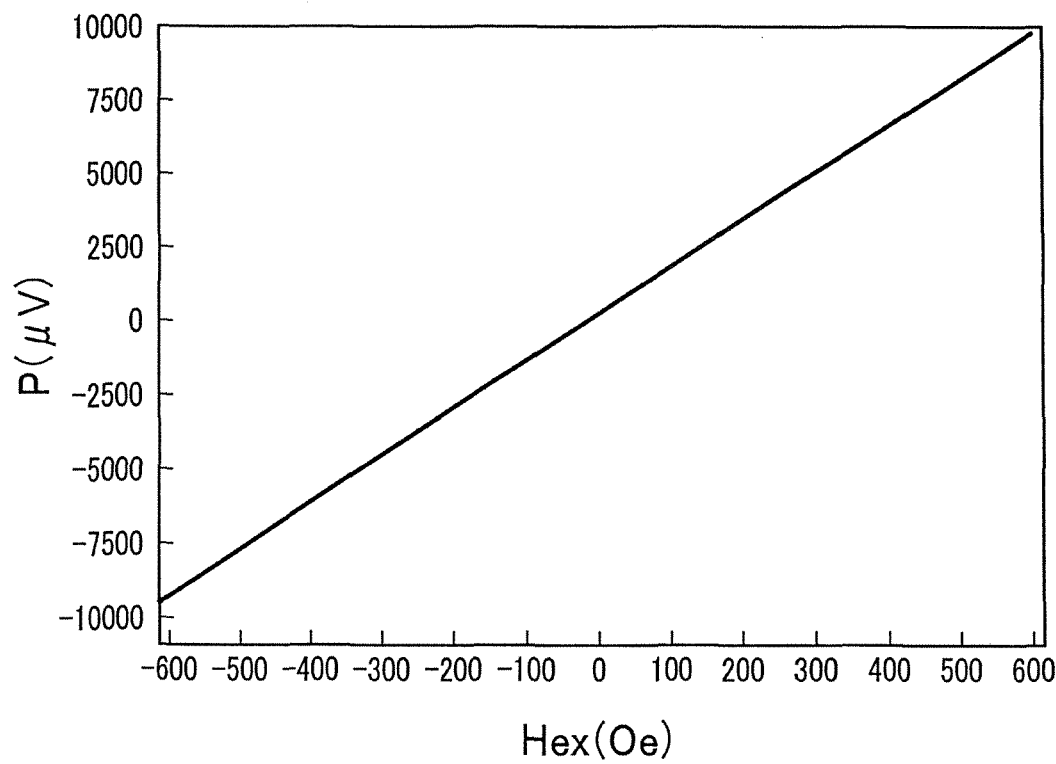
FIG. 16B is a graph indicative of the sensor output (P) vs. the externally applied magnetic field (Hex) of a sample having its performance restored by re-magnetization back to normal.

And then, there was experimentation done in which the re-magnetizer unit (diodes) was actuated to re-magnetize the bias magnetic field-applying layers 6. That is, the re-magnetizer unit was actuated such that a given current conducted through the reset lead to apply a magnetic field of 1.5 kOe to the bias magnetic field-applying layers 6. As a result of examining the relation of sensor output (P) vs. externally applied magnetic field (Hex) of the ensuing sample, it was found that there was good linearity obtained as shown in the graph of FIG. 16B. In other words, it was confirmed that by the re-magnetizer unit of the invention, the bias magnetic field-applying layers were well re-magnetized to allow the degraded performance to go back to normal. It was also ascertained that when the re-magnetizer unit was operated in such a way to apply a magnetic field of at least 1.2 kOe to the bias magnetic field-applying layers 6, good re-magnetization took place.

From the aforesaid results, the advantages of the invention would be undisputed. That is, the present invention provides a thin-film magnetic head comprising a magneto-resistive effect device of the CPP (current perpendicular to plane) structure including a multilayer film comprising a stack of a fixed magnetization layer, a nonmagnetic layer and a free layer stacked together in order, with a sense current applied in the stacking direction of the multilayer film, and an upper shield layer and a lower shield layer located with the magneto-resistive effect device held between them in the thickness direction, and further comprising bias magnetic field-applying layers at both ends of said multilayer film in the widthwise direction and a re-magnetizer unit designed such that when said bias magnetic field-applying layers malfunction, they are re-magnetized to go back to normal. Therefore, the invention has a very excellent advantage in that when the bias magnetic field-applying layers degrade with an increasing error rate of the hard disk system, it is possible to re-magnetize them without dismantling the hard disk system, so that the hard disk system can be kept operating normally.

INDUSTRIAL APPLICABILITY

The present invention can have applications to the industry of magnetic disk systems comprising a magneto-resistive effect device adapted to read the signal strength of magnetic recording media as signals.

What we claim is:
1. A thin-film magnetic head, comprising:
a magneto-resistive effect device of a CPP (current perpendicular to plane) structure including a multilayer film in which a fixed magnetization layer,
a non-magnetic layer and a free layer are stacked together in order, with a sense current passing in a thickness direction of said multilayer film; and
an upper shield layer and a lower shield layer located such that said magneto-resistive effect device is held between them in the thickness direction, wherein:
said free layer functions such that a direction of magnetization changes depending on an external magnetic field,
said fixed magnetization layer has a direction of magnetization fixed by an antiferromagnetic layer exerting pinning action, p1 said fixed magnetization layer, said non- magnetic layer and said free layer extend rearward from an air bearing surface that is a plane in opposition to a medium, said multilayer film is provided with a bias magnetic field-applying layer at each end in a widthwise direction and a re-magnetizer unit; so that when said bias magnetic field-applying layer malfunctions, said re-magnetizer unit is actuated to re-magnetize said bias magnetic field-applying layer to get it back to normal, and said re-magnetizer unit is a diode formed at a position between said upper shield layer and said lower shield layer and in the rear of said magneto-resistive effect device, so that a voltage higher than a diode operating voltage (a threshold value) is applied between said upper shield layer and said lower shield layer, thereby conducting a current through said diode to generate a magnetic field that in turn re-magnetizes said bias magnetic field-applying field.

2. The thin-film magnetic head according to claim 1, wherein said diode is a Schottky diode or a PN junction diode.

3. The thin-film magnetic head according to claim 1, wherein said magneto-resistive effect device of the CPP structure is a TMR device, or a CPP-MR device.

4. A head gimbal assembly, further comprising:
a slider including a thin-film magnetic head as recited in claim 1 and located in opposition to a recording medium, and
a suspension adapted to resiliently support said slider.

5. A magnetic disk system, further comprising:
a slider including a thin-film magnetic head as recited in claim 1 and located in opposition to a recording medium, and
a positioning means adapted to support and position said slider with respect to said recording medium.

6. A thin-film magnetic head, comprising:
a magneto-resistive effect device of a CPP (current perpendicular to plane) structure including a multilayer film in which a fixed magnetization layer,
a non-magnetic layer; and a free layer are stacked together in order, with a sense current passing in a thickness direction of said multilayer film; and
an upper shield layer and a lower shield layer located such that said magneto-resistive effect device is held between them in the thickness direction, wherein:
said free layer functions such that a direction of magnetization changes depending on an external magnetic field,
said fixed magnetization layer has a direction of magnetization fixed by an antiferromagnetic layer exerting pinning action,
said fixed magnetization layer, said nonmagnetic layer and said free layer extend rearward from an air bearing surface that is a plane in opposition to a medium,
said multilayer film is provided with a bias magnetic field-applying layer at each end in a widthwise direction and a re-magnetizer unit; so that when said bias magnetic field-applying layer malfunctions, said re-magnetizer unit is actuated to re-magnetize said bias magnetic field-applying layer to get it back to normal, and
said re-magnetizer unit is a diode formed substantially below said lower shield layer, so that a voltage higher than a diode operating voltage (a threshold value) is applied between said upper shield layer and said lower shield layer, thereby conducting a current through said diode to generate a magnetic field that in turn re-magnetizes said bias magnetic field-applying field.

7. The thin-film magnetic head according to claim 6, wherein said diode is a PN junction diode, a Zener diode, an avalanche diode, or a Schottky diode.

8. The thin-film magnetic head according to claim 6, wherein said magneto-resistive effect device of the CPP structure is a TMR device, or a CPP-MR device.

9. A head gimbal assembly, further comprising:
a slider including a thin-film magnetic head as recited in claim 6 and located in opposition to a recording medium; and
a suspension adapted to resiliently support said slider.

10. A magnetic disk system, further comprising:
a slider including a thin-film magnetic head as recited in claim 6 and located in opposition to a recording medium; and
a positioning means adapted to support and position said slider with respect to said recording medium.

11. A thin-film magnetic head, comprising:
a magneto-resistive effect device of a CPP (current perpendicular to plane) structure including a multilayer film in which a fixed magnetization layer,
a non-magnetic layer and a free layer are stacked together in order, with a sense current passing in a thickness direction of said multilayer film; and
an upper shield layer and a lower shield layer located such that said magneto-resistive effect device is held between them in the thickness direction, wherein:
said free layer functions such that a direction of magnetization changes depending on an external magnetic field,
said fixed magnetization layer has a direction of magnetization fixed by an antiferromagnetic layer exerting pinning action,
said fixed magnetization layer, said nonmagnetic layer and said free layer extend rearward from an air bearing surface that is a plane in opposition to a medium,
said multilayer film is provided with a bias magnetic field-applying layer at each end in a widthwise direction and a re-magnetizer unit; so that when said bias magnetic field-applying layer malfunctions, said re-magnetizer unit is actuated to re-magnetize said bias magnetic field-applying layer to get it back to normal, wherein the magnetic field for re-magnetization applied to said bias magnetic field-applying layer is at least 1.2 kOe.

12. The thin-film magnetic head according to claim 11, wherein said magneto-resistive effect device of the CPP structure is a TMR device, or a CPP-MR device.

13. A head gimbal assembly, further comprising:
a slider including a thin-film magnetic head as recited in claim 11 and located in opposition to a recording medium; and
a suspension adapted to resiliently support said slider.

14. A magnetic disk system, further comprising:
a slider including a thin-film magnetic head as recited in claim 11 and located in opposition to a recording medium; and
a positioning means adapted to support and position said slider with respect to said recording medium.

* * * * *